US010590967B2

(12) United States Patent
Wang et al.

(10) Patent No.: US 10,590,967 B2
(45) Date of Patent: Mar. 17, 2020

(54) UNIDIRECTIONAL LIQUID TRANSPORT SYSTEMS AND METHODS OF MANUFACTURE THEREOF

(71) Applicant: City University of Hong Kong, Hong Kong (HK)

(72) Inventors: Zuankai Wang, Hong Kong (HK); Jiaqian Li, Hong Kong (HK); Xiaofeng Zhou, Shanghai (CN)

(73) Assignee: CITY UNIVERSITY OF HONG KONG, Kowloon Tong (HK)

( * ) Notice: Subject to any disclaimer, the term of this patent is extended or adjusted under 35 U.S.C. 154(b) by 151 days.

(21) Appl. No.: 15/935,401

(22) Filed: Mar. 26, 2018

(65) Prior Publication Data

US 2019/0293094 A1 Sep. 26, 2019

(51) Int. Cl.
*F15C 1/06* (2006.01)
*F15D 1/00* (2006.01)
*B81B 1/00* (2006.01)

(52) U.S. Cl.
CPC ............. *F15D 1/0025* (2013.01); *B81B 1/00* (2013.01); *F15D 1/0085* (2013.01)

(58) Field of Classification Search
CPC ...... F15D 1/0025; F15D 1/0085; F15D 1/003; F15D 1/0035; F15D 1/12; B81B 1/00
USPC .................... 137/814, 13, 833, 484.2, 484.4
See application file for complete search history.

(56) References Cited

U.S. PATENT DOCUMENTS

| 5,265,636 | A  | * | 11/1993 | Reed ...................... F15C 1/146 137/14 |
| 8,122,909 | B2 | * | 2/2012 | Tonkovich ............ B01F 5/0611 137/833 |
| 8,147,562 | B2 | * | 4/2012 | Vacanti .................. C12M 25/14 623/23.72 |
| 8,702,726 | B2 | * | 4/2014 | Gartstein ........... A45D 26/0004 606/131 |
| 9,174,211 | B2 | * | 11/2015 | Jones .................. B01L 3/50273 |

(Continued)

OTHER PUBLICATIONS

Li, J., et al., "Topological liquid diode", Sci. Adv. 2017; 3: eaao3530, Oct. 27, 2017, 8 pgs.

(Continued)

*Primary Examiner* — Minh Q Le
(74) *Attorney, Agent, or Firm* — Melvin Li; Hesling Rothenberg Farley & Mesiti PC

(57) ABSTRACT

There is disclosed a unidirectional liquid transport system. The system, or a liquid diode, has an array of elongate units. Each unit is defined by a surrounding fencing, and includes a region generally resembling a U-shaped micro-scale island with a proximal end on one side having an opening and a distal end on the opposite side thereof. A channel is defined between a lateral side of the island and an adjacent fencing thereof, and the channel is divergent from the proximal end towards the distal location on the opposite side thereof. The island includes a reentrant member configured to, upon contact with droplets of a liquid to be transported, initially arrest flow of the liquid and produce a pinning acting to allow building up of excess surface energy, and subsequently cause coalescence of the liquid thus converting the surface energy to kinetic energy for movement of the liquid; and surfaces of the units are fabricated on silicon wafer.

18 Claims, 17 Drawing Sheets

(56) References Cited

U.S. PATENT DOCUMENTS

| | | | | |
|---|---|---|---|---|
| 2007/0184672 | A1* | 8/2007 | Sandoz | B01F 5/061 |
| | | | | 438/800 |
| 2008/0170936 | A1* | 7/2008 | Den Toonder | B01F 13/0059 |
| | | | | 415/140 |
| 2014/0318657 | A1* | 10/2014 | Bixler | F15D 1/003 |
| | | | | 138/39 |
| 2014/0332098 | A1* | 11/2014 | Juncker | B01L 3/50273 |
| | | | | 137/511 |
| 2014/0339090 | A1* | 11/2014 | Huang | B01L 3/50273 |
| | | | | 204/603 |
| 2016/0025116 | A1* | 1/2016 | Vulto | B01L 3/502707 |
| | | | | 137/13 |
| 2016/0202153 | A1* | 7/2016 | Gadini | B01L 3/502753 |
| | | | | 435/308.1 |
| 2016/0310947 | A1* | 10/2016 | Walsh | G01N 1/38 |
| 2017/0044002 | A1* | 2/2017 | Hariyama | B81B 1/00 |
| 2017/0259259 | A1* | 9/2017 | Oonuki | B01J 19/00 |

OTHER PUBLICATIONS

Stone, H.A., et al., "Engineering Flows in Small Devices: Microfluidics Toward a Lab-on-a-Chip", Annu. Rev. Fluid Mech. 2004. vol. 36: pp. 381-411, plus Appendices C1-C4, and table of contents (37 pgs.).

Chaudhury, M, et al., "Generation of Motion of Drops with Interfacial Contact", Langmuir 2015, vol. 31, pp. 9266-9281 (16 pgs.).

Wang, J.Z., et al., "Dewetting of conducting polymer inkjet droplets on patterned surfaces", Nature Materials, vol. 3, Mar. 2004, pp. 171-176 (6 pgs.).

Seemann, R., et al., "Droplet based microfluidics", 2012 Rep. Prog. Phys. 75 016601, (http://iopscience.iop.org/0034-4885/75/1/016601), 43 pgs.

Daniel, S., "Fast Drop Movements Resulting from the Phase Change on a Gradient Surface", www.sciencemag.org, Science, Jan. 26, 2001, vol. 291, pp. 633-636 (5 pgs.).

Wong, W.S.Y., et al., "Mimosa Origami: A nanostructure-enabled directional self-organization regime of materials," Sci. Adv. 2016; 2: e1600417, Jun. 24, 2016, pp. 1-9 (10 pgs.).

Chu, K., et al., "Uni-directional liquid spreading on asymmetric nanostructured surfaces", Nature Materials, vol. 9, May 2010, www.nature.com/naturematerials, pp. 413-417 (5 pgs.).

Park, K., et al., "Condensation on slippery asymmetric bumps", Nature, 2016, 5 pgs.

Malvadkar, N.A., et al., "An engineered anisotropic nanofilm with unidirectional wetting properties", Nature Materials, vol. 9, Dec. 2010, www.nature.com/naturematerials, pp. 1023-1028 (6 pgs.).

Ichimura, K., et al., "Light-Driven Motion of Liquids on a Photoresponsive Surface", www.sciencemag.org, Science, Jun. 2000, vol. 288, pp. 1624-1626 (4 pgs.).

Lv, J., et al., "Photocontrol of fluid slugs in liquid crystal polymer microactuators", Nature, Sep. 8, 2016, vol. 537, pp. 179-185 (7 pgs.).

Li, J., et al., "Directional transport of high-temperature Janus droplets mediated by structural topography", Nature Physics, Advance Online Publication, www.nature.com/naturephysics, 2016, pp. 1-8.

Chaudhury, M.K, et al., "Activated drops: Self-excited oscillation, critical speeding and noisy transport", Eur. Phys. J. E, 2013, vol. 36, 14 pgs.

Schutzius, T.M., et al., "Spontaneous droplet trampolining on rigid superhydrophobic surfaces", Nature, vol. 527, 5 Nov. 2015, 18 pgs.

Prakash, M., "Surface Tension Transport of Prey by Feeding Shorebirds: The Capillary Ratchet", Science, vol. 320, May 16, 2008, pp. 931-934 (5 pgs.).

Chen, H., et al., "Continuous directional water transport on the peristome surface of Nepenthes alata", Nature, vol. 532, Apr. 7, 2016, 7 pgs.

Zheng, Y., et al., "Directional water collection on wetted spider silk", Nature, vol. 463, Feb. 4, 2010, pp. 640-643 (4 pgs.).

Comanns, P., et al., "Directional, passive liquid transport: the Texas horned lizard as a model for a biomimetic 'liquid diode'", 2015, J. R. Soc. Interface 12: 20150415 (downloaded from http://rsif.royalsocietypublishing.org/ on Oct. 10, 2016), 8 pgs.

Chaudhury, M., et al., "How to Make Water Run Uphill", Science, vol. 256, Jun. 12, 1992, pp. 1539-1541 (4 pgs.).

Yang, X.M., et al., "Asymmetric liquid wetting and spreading on surfaces with slanted micro-pillar arrays", Soft Matter, 2013, vol. 9, pp. 11113-11119.

Ville Jokinen, V., et al., "Microstructured Surfaces for Directional Wetting", Adv. Mater., 2009, vol. 21, pp. 4835-4838.

Li, C., et al., "Uni-Directional Transportation on Peristome-Mimetic Surfaces for Completely Wetting Liquids", Angew. Chem., 2016, vol. 128, pp. 1-6.

Hancock, M., et al., "Bioinspired Directional Surfaces for Adhesion, Wetting, and Transport", Adv. Funct. Mater., 2012, vol. 22, pp. 2223-2234.

Liu, C., et al., "Long-range spontaneous droplet self-propulsion on wettability gradient surfaces", Scientific Reports, 7: 7552, 8 pgs.

Li, J., et al., "Oil droplet self-transportation on oleophobic surfaces", Sci. Adv., 2016, vol. 2 : e1600148, Jun. 17, 2016, 7 pgs.

Reyssat, M., et al., "Drops onto gradients of texture", EPL, vol. 87 (2009) 36003, pp. 1-5 (6 pgs.).

Zhao, H., et al., "From Droplet Growth to Film Growth on a Heterogeneous Surface: Condensation Associated with a Wettability Gradient", Langmuir, 1995, vol. 11, pp. 627-634.

Chaudhury, M., et al., "Coalescence of drops near a hydrophilic boundary leads to long range directed motion", Extreme Mechanics Letters, vol. 1 (2014), pp. 104-113.

Tuteja, A., et al., "Designing Superoleophobic Surfaces", Dec. 7, 2007, vol. 318, Science, www.sciencemag.org, pp. 1618-1622.

Liu, T. et al., "Turning a surface superrepellent even to completely wetting liquids", Nov. 28, 2014, vol. 346, Issue 6213, Science,www.sciencemag.org, pp. 1096-1100.

Chen, Y., et al., "Study on flow and heat transfer characteristics of heat pipe with axial "Ω"-shaped microgrooves", International Journal of Heat and Mass Transfer, vol. 52 (2009), pp. 636-643.

Li, C., et al., "Nanostructured Copper Interfaces for Enhanced Boiling", small 2008, vol. 4, No. 8, pp. 1084-1088.

Weislogel, M., et al., "Capillary flow in an interior corner", J. Fluid Mech. (1998), vol. 373, pp. 349-378.

Chaudhury, M., et al., "Super spreading of oil by condensed water drops", Soft Matter, 2005, vol. 1, pp. 431-435.

Bush, J., et al., "An experimental investigation of the stability of the circular hydraulic jump", J. Fluid Mech. (2006), vol. 558, pp. 33-52.

Dressaire, E., et al., "Thin-Film Fluid Flows over Microdecorated Surfaces: Observation of Polygonal Hydraulic Jumps", Physical Review Letters, 2009, PRL vol. 102, 194503, pp. 1-4.

Lomholt, M., et al., "Microscopic Origin of the Logarithmic Time Evolution of Aging Processes in Complex Systems", Physical Review Letters, 2013, PRL vol. 110, 208301, pp. 1-5.

Beebe, D., et al., "Physics and Applications of Microfluidics in Biology", Annu. Rev. Biomed. Eng. 2002, vol. 4, pp. 261-286, and table of contents (29 pgs.).

Bliznyuk, O., et al., "Smart Design of Stripe-Patterned Gradient Surfaces to Control Droplet Motion", Langmuir, 2011, vol. 27, pp. 11238-11245.

Sun, C., et al., "Control of water droplet motion by alteration of roughness gradient on silicon wafer by laser surface treatment", Thin Solid Films, vol. 516 (2008), pp. 4059-4063.

Wu, J., et al., "Do droplets always move following the wettability gradient?", Applied Physics Letters, 2011, vol. 98, 204104, 4 pgs.

Ito, Y., et al., "The Movement of a Water Droplet on a Gradient Surface Prepared by Photodegradation", Langmuir, 2007, vol. 23, pp. 1845-1850.

Zhu, X. et al., "Experiments and analysis on self-motion behaviors of liquid droplets on gradient surfaces", Experimental Thermal and Fluid Science vol. 33 (2009), pp. 947-954.

Khoo, H.S., et al., "Spontaneous high-speed transport of subnanoliter water droplet on gradient nanotextured surfaces", Applied Physics Letters, 2009, vol. 95, 063108, pp. 1-3 (4 pgs.).

(56) References Cited

OTHER PUBLICATIONS

Chen, H., et al., "A Novel Bioinspired Continuous Unidirectional Liquid Spreading Surface Structure from the Peristome Surface of Nepenthes alata", small (www.small-journal.com), 2016, 6 pgs.

Kim, T., et al., "Unidirectional wetting and spreading on stooped polymer nanohairs", Soft Matter, 2009, vol. 5, pp. 4131-4135 (6 pgs.).

Kundan, A., et al., "Condensation on Highly Superheated Surfaces: Unstable Thin Films in a Wickless Heat Pipe", Physical Review Letters, 2017, PRL vol. 118, 094501, pp. 1-6.

"3-3.3 Noncircular Ducts", Viscous Fluid Flow / Solutions of the Newtonian Viscous-Flow Equations, pp. 119-122.

Dimaki, M., et al., "3.3 Lumped Element Modeling", Design and Simulation of Lab-on-a-Chip Devices, pp. 35-37.

"Liquid diodes", Physics Today, Dec. 2017, p. 72.

\* cited by examiner

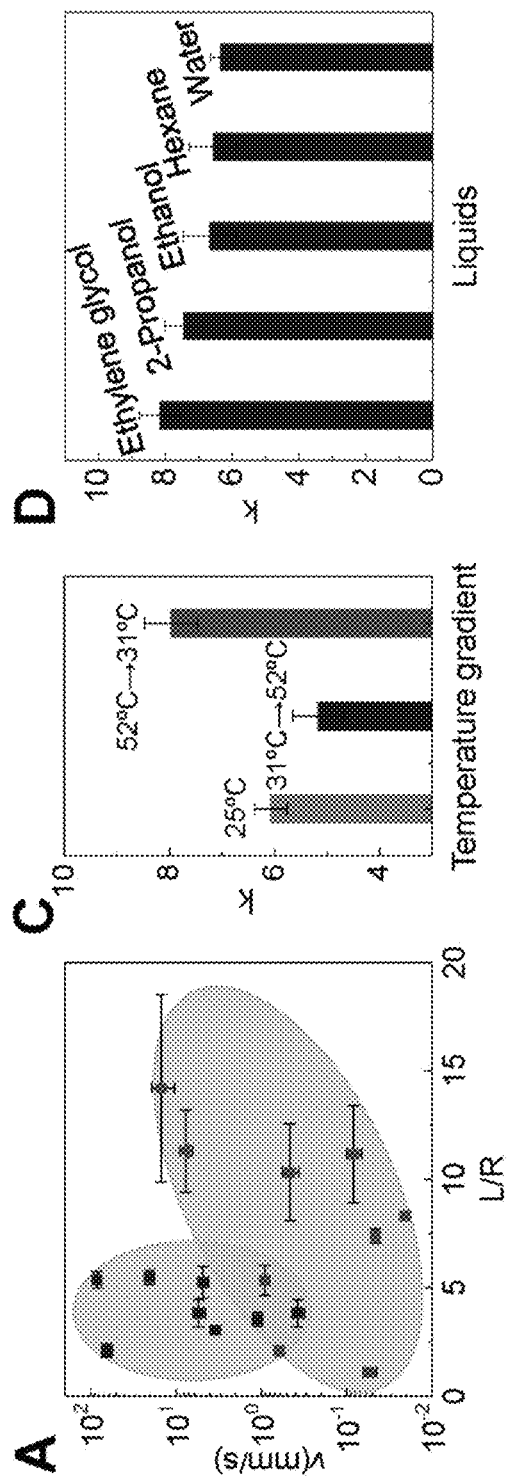
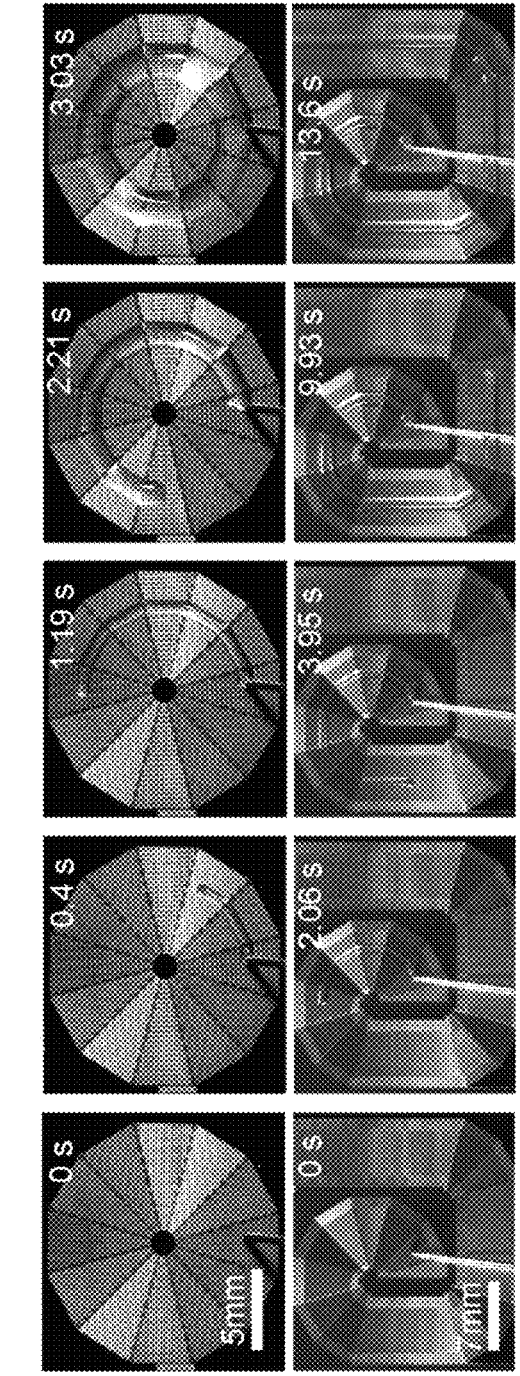
FIGS. 4A to 4D

UNIDIRECTIONAL LIQUID TRANSPORT SYSTEMS AND METHODS OF MANUFACTURE THEREOF

FIELD OF THE INVENTION

The present invention is concerned with unidirectional liquid transport systems, or topological liquid diodes, and methods of manufacture of making thereof.

BACKGROUND OF THE INVENTION

Due to multifarious applications of small-scale liquid transport, there had been different proposals on how such liquid transport could be achieved. Despite much effort in this arena, there had been many difficulties which, in the past, were not able to address, or at least not adequately. For example, the speed or motion of liquid transport was usually slow; the transport distance was relatively limited; and the flow direction was not controllable or least not well controlled due to unwanted pinning of contact lines by defects on a surface of the liquid transport system.

The present invention seeks to address the above problems, or at least to provide an alternative to the public.

SUMMARY OF THE INVENTION

According to a first aspect of the present invention, there is provided a unidirectional liquid transport system comprising an array of elongate units, wherein:

each said unit is defined by a surrounding fencing;

each said unit includes a region generally resembling a U-shaped micro-scale island with a proximal end on one side having an opening and a distal end on the opposite side thereof;

a channel is defined between a lateral side of the island and an adjacent fencing thereof, and the channel is divergent from the proximal end towards the distal end, with a divergence angle α of the channel of 0°<α<10°;

said island is provided with a reentrant member defining an outer rim with a width "D" at the proximal end and with a length "L";

said island provided with the reentrant member defines an inner rim with a width "d" at the proximal end and with a length "l";

the width of the channel at the proximal end is 0>s>30 µm;

"D" is substantially 0 to 1 mm;

"L" is 0 to 1 mm;

0<"d"<"D"; and

0<"l"<L.

The units may be integrally formed. By "integrally formed", it refers to the units may unitarily with a seamless coupling of various structures thus creating a unique unidirectional liquid transport behavior on the unidirectional liquid transport system.

Preferably, each unit may have a rectangular profile.

Suitably, the island may be arranged between a pair of said channels on opposite lateral sides thereof.

Advantageously, the island may be provided with a trough surrounded by the reentrant member and the proximal end of said island resembles the opening of the trough, and wherein, in use, liquid migration moves in a direction from the opening to the distal end of said island.

In an embodiment, the reentrant member generally may resemble a lip inwardly extending and defining the outer and inner rims of the island. The lip at the inner rim may have a curved or concave configuration. The trough may have a substantially flat floor.

The lip may be arranged substantially in parallel to said floor.

In one embodiment, the length of the lip, δ, may be 1 µm<δ<10 µm.

Preferably, the array may be formed from photolithography.

According to a second aspect of the present invention, there is provided a unidirectional liquid transport system comprising an array of elongate units, wherein:

each said unit is defined by a surrounding fencing;

each said unit includes a region generally resembling a U-shaped micro-scale island with a proximal end on one side having an opening and a distal end on the opposite side thereof;

a channel is defined between a lateral side of the island and an adjacent fencing thereof, and the channel is divergent from the proximal end towards the distal location on the opposite side thereof;

said island includes a reentrant member configured to, upon contact with droplets of a liquid to be transported, initially arrest flow of the liquid and produce a pinning acting to allow building up of excess surface energy, and subsequently cause coalescence of the liquid thus converting the surface energy to kinetic energy for movement of the liquid; and surfaces of the units are fabricated on silicon wafer.

Preferably, the reentrant member may have an outer rim with a width "D" at the proximal end and with a length "L"; the island may have the reentrant member with an inner rim with a width "d" at the proximal end and with a length "l"; the width of the channel at the proximal end may be 0>s>30 µm; "D" is substantially 0 to 1 mm; "L" is 0 to 1 mm; −0<"d"<"D"; and 0<"l"<L.

According to a third aspect of the present invention, there is provided a method of manufacture of a unidirectional liquid transport system as described above, comprising the sequential steps of:

depositing a layer of photoresist as a protective mask by photolithography;

effecting an anisotropic etching via reactive ion etching;

removing the photoresist by plasma stripping and wet cleaning;

fabricating a mask layer to deposit a layer of silicon oxide;

photolithographic patterning to selectively remove the silicon oxide layer on positions of cavity structures desired to be formed; and isotropically etching silicon for exposing the cavity structures.

Preferably, the anisotropic etching may be deep reactive ion etching (DRIE).

Suitably, the mask layer may be formed by thermal oxidation.

Advantageously, the mask layer may have a thickness of substantially 1 µm.

In an embodiment, the photolithographic patterning may be reactive ion etching.

In one embodiment, the isotropically etching may be deep reactive ion etching (DRIE) or $XeF_2$.

According to a fourth aspect of the invention, there is provided with an apparatus comprising a unidirectional liquid transport system as described above. Such an apparatus may be an ink cartridge apparatus, water management apparatus or an emulsion separation apparatus.

BRIEF DESCRIPTION OF THE DRAWINGS

Some embodiments of the present invention will now be explained, with reference to the accompanied drawings, in which:—

FIGS. 1A to 1F include photographic images and graphs showing the design and characterization of a liquid diode system, in which:

FIG. 1A is a scanning electron microscope (SEM) image of an embodiment of a unidirectional liquid transport system, or liquid diode in accordance of the present invention;

FIG. 1B is a magnified SEM image (from above) of an array of some of the U-shaped islands disposed in the system of FIG. 1A, each of the islands provided with a cavity on one (or proximal) end;

FIG. 1C is a magnified perspective view showing a cross section of one of the islands of FIG. 1B, the perspective view showing a reentrant structure defining the cavity of FIG. 1C and an inner wall of the reentrant structure defining the cavity;

FIG. 1D are optical images of time-dependent directional liquid spreading on the liquid diode of FIG. 1A;

FIG. 1E is a graph of a normalized plot of time-dependent liquid spreading on the liquid diode of FIG. 1A;

FIG. 1F is a graph of rescaled plot of the data summarized from FIG. 1E;

FIGS. 2A to 2D illustrates microscopic spreading dynamics, in which:

FIG. 2A is a schematic depiction of the corner flow induced by the side channels and eventual filling-up of the cavities with reentrant structure;

FIG. 2B schematically demonstrates the corner flow;

FIG. 2C provides an illustration of visualization of the time-dependent flow behavior of a water droplet on liquid diode;

FIG. 2D is a schematic drawing showing the spreading dynamics of a primary droplet in the forward direction, which consists of pinning of the advancing edge, coalescence, and subsequent hydraulic jump with the precursor film accumulated in the re-entrant cavity;

FIGS. 2A to 3F are representations illustrating microscopic pinning dynamics and quantification of rectification coefficient, in which:

FIG. 3A are SEM images showing the pinning of advancing liquid at the reentrant structure (top);

FIG. 3B are schematic drawings of the effect of reentrant structure (in green) on the liquid penetration;

FIG. 3C is a SEM image of the breakdown of the liquid pinning on control surface without the reentrant structure;

FIG. 3D is a schematic drawing of the flow pathways in spreading and pinning directions;

FIG. 3E is a graph plotting the rectification coefficient (k) versus R', the ratio of hydraulic resistances between two different directions;

FIG. 3F is a representation showing comparison of the transport performances between different surfaces;

FIGS. 3A to 4D are representation showing generality of the liquid diode, in which:—

FIG. 4A is a graph showing the comparison of transport performances among different surfaces;

FIG. 4B are representations showing continuous and directional water transportation on surfaces with circular and spiral pathways;

FIG. 4C is a graph illustrating variation of the rectification coefficient under different temperature gradient, indicative of the stability of the directional liquid transport;

FIG. 4D is a graph showing the generality of directional liquid transport for all kinds of liquids;

DETAILED DESCRIPTION OF PREFERRED EMBODIMENTS OF THE INVENTION

Figures 1A, 1B, 1C, 1D, 1E, 1F:
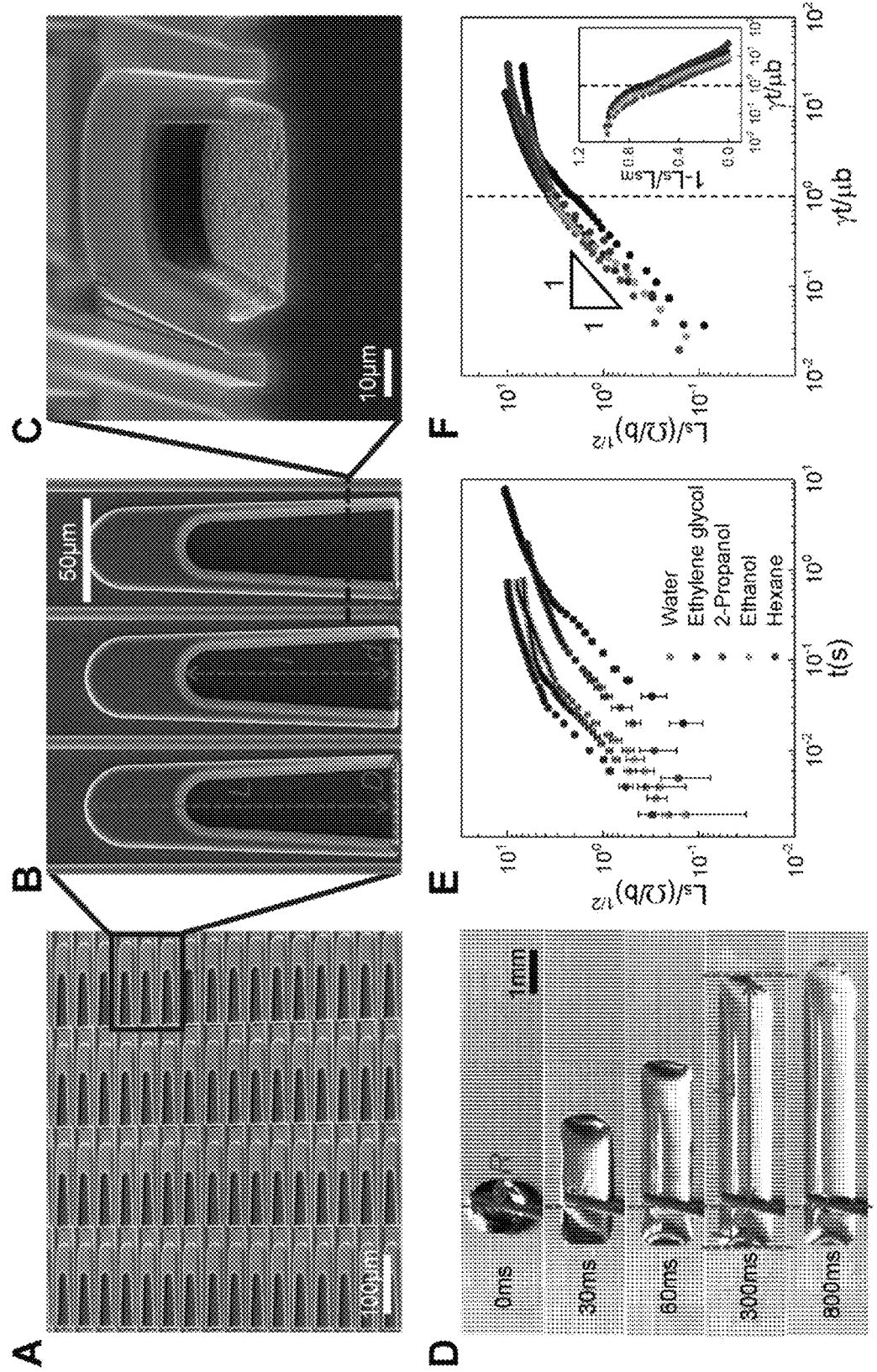

Directed and spontaneous transport of a liquid on a solid surface is highly desired in various settings that range from microfluidics, printing, oil-water separation, to water harvesting technologies. While this field of research has much evolved over the last two decades, the available technologies have been far from what would be needed for controlling a desired fluidic process with a high degree of fidelity. The principal detriment to the generation of such type of a fluidic motion arises from surface defects that pin the droplet edge thus thwarting its motion. In order to combat the pinning forces, an external source of energy is generally needed that often mimics the rectification of the random motion of particles manifesting in various natural and man-made settings. Remarkably, many living organisms, such as the pitcher plant, cactus, and lizard, perform the task of liquid transportation at a small scale with immaculate precision by taking advantage of surface topography alone. In recent years, extensive efforts have been directed towards mimicking such types of a transport diversity that fundamentally resort to the breaking of wetting symmetry. Despite commendable progress, it remains a daunting undertaking to mimic the structural and the functional sophistication inherent in living organisms in a facile and reproducible manner.

The present invention provides an improved system making use of a unique topological structure. Among other technical characteristics, the improved system can, during a liquid transport exercise, break contact line pinning through efficient conversion of excess surface energy to kinetic energy at an advancing edge of droplets of the liquid whilst simultaneously arrest reverse motion of the droplets via strong pinning. Functionally, the system can provide a topological fluid diode that allows for a more rapid, unidirectional, and longer-distance transport of any kind of liquid without the need for an external energy input. The following provides further illustration of the background and characterization of the present invention.

One inherent challenge in attaining a unidirectional and continuous liquid transport stems from the fact that one edge of the droplet needs to be activated, whereas its other edge needs to remain pinned. To meet this objective, during the course leading to the present invention, much effort was focused on addressing issues of pinning barriers. Specifically, the effort had led to a system which allows liquid droplets to be moved to coalesce with each other near a pinning boundary. This had then led to a desired unidirectional motion of the droplets achieved by leveraging the coalescence of a pinned droplet with a thin precursor film spreading rapidly ahead of the edge. The same topographical complexity or structure, in turn, leads to a simultaneous arrest of the reverse motion of the droplet via strong pinning. The design of this unidirectional liquid transport system, or liquid diode shifts away from the conventional paradigm in which a continuous gradient of wettability is invariably used to generate droplet motion.

In an embodiment, there is provided with a unidirectional liquid transport system comprising an array of elongate units configured in a grid format, wherein:

each unit is defined by a surrounding fencing, each unit includes a region generally resembling a U-shaped micro-scale island with a proximal end with an opening and a distal end on the opposite side thereof, a channel is defined between a lateral side of the island and an adjacent fencing thereof, and the channel is divergent from the proximal end on one side towards the distal location on the opposite side thereof, the island includes a reentrant member configured to, upon contact with droplets of a liquid to be transported, initially arrest flow of the liquid and produce a pinning acting to allow building up of excess surface energy, and subsequently cause coalescence of the liquid thus converting the surface energy to kinetic energy for movement of the liquid, and surfaces of the units are fabricated on silicon wafer.

In a specific embodiment, the reentrant member has an outer rim with a width "D" at the proximal end and with a length "L", the island has the reentrant member with an inner rim with a width "d" at the proximal end and with a length "l", the width of the channel at the proximal end is 0>s>30 µm, "D" is substantially 0 to 1 mm, "L" is 0 to 1 mm, 0<"d"<"D", and 0<"l"<L. Studies leading to the present invention have identified that the system configured with these characteristics would deliver satisfactory or at least workable liquid transport behavior.

The design of U-shaped islands with a convergent width from the outlet of the cavity to the other end is to generate two divergent side-channels between island and fences, which allows for the spreading routes for the precursor film as well as the primary droplet. The divergent side-channel not only enhances the droplet spreading to diverged side in the preferential direction, but also creates a concave meniscus to assist the pinning effect in the backflow direction. The apex angle of the island with respect to the scale size of the reentrant feature at the end of the cavity should be within a predetermined range.

The reentrant feature playa an important rile to prevent the hydraulic jumping to develop a unidirectional liquid transport. In this regard, the reentrant feature should preferably be designed to be around the cavity edge and be parallel to the floor of the cavity. Also, the length of the reentrant should be specified as 1 µm<δ<10 µm. When the flange is too long, the liquid diode surface becomes fragile and has a short working lifetime. Otherwise, it cannot affect adequately hydraulic jumping behavior at the backflow direction.

FIG. 1A shows the scanning electron microscopic (SEM) image of the as-designed liquid diode, consisting of an array of U-shaped islands spatially confined in periodically patterned fences. The width of the U-shaped islands is designed to decrease gradually from the opening end to the other end.

FIG. 1B clearly shows that two diverging side-channels are naturally formed within fences on opposite lateral sides of each island. In this regard, it is noted that L and D are the length and width of the island, respectively; l and d are the length and width of the cavity, respectively; and s is the opening width of divergent side-channel. In this particular embodiment, the dimensions of L~150 µm, D~50 µm, l~100 µm, d~30 µm, s~5 µm are used.

FIG. 1C illustrates an inner side of cavity in the U-shaped island specially designed with a reentrant structure in order to constrict the back flow of the liquid. In this embodiment, α is the apex α angle of the diverging side-channel being α~2.2°, although studies leading to the present invention have shown that the apex angle may from 0<α<10°.

The width (d) and length (l) of the cavity, the total width and length of the island (D, L), as well as the spacing between individual islands can be varied as long as they are within parameters. In preferred embodiments, all the surfaces are fabricated on a silicon wafer using standard MEMS process. It is demonstrated that a water droplet (for example, ~5 µL) deposited on the as-fabricated surface displays an asymmetric transport behavior. FIG. 1D demonstrated that there is a dominant propagation of the liquid in the lateral direction towards the opening of the U-shaped islands, denoted as the preferential direction. In this figure, it is shown that the water droplet (~5 µL) deposited on the surface propagates preferentially in one direction, i.e. the direction towards the opening of the cavities and gets pinned in the reverse direction. In this embodiment, the rectification coefficient is 5.76. However, studies show that liquid diodes with a rectification coefficient of 3.2<k<6.4 are also workable.

In the first few milliseconds, the droplet also spreads slightly in the direction opposite to the opening of cavities (denoted as the reverse direction), which, nevertheless, becomes rapidly pinned by the convexity of the U-shaped channel. Taken together, these two functions display the typical signature of a directed liquid transport, which is also manifested with any other liquid including ethanol, ethylene glycol and alkanes that meet the Concus-Finn corner flow conditions, in which the intrinsic contact angle (θ) and the half-angle (β) of the corner in the microchannel follow the inequality condition: 0<π/2−β. Please see FIG. 1E. After sufficiently long time, the elongated droplet stops spreading. By denoting the spreading length of the droplet in the major spreading direction ($L_s$) relative to that in the pinning direction ($L_p$), a rectification coefficient (k) can be defined as $L_s/L_p$ that quantifies such a diode-like behavior. For the as-fabricated liquid diode shown in FIG. 1A, k is measured to be 5.76, which is larger than that of any surfaces reported previously.

The above and the corresponding figures have demonstrated that the overall spreading dynamics of liquids on a surface of the liquid diode resulted from discrete events or stages.

The uniqueness of the present invention is concerned the technical results of the spreading liquid having overcome the pinning barrier. Specifically, the unidirectional spreading results from the combination of events in which a precursor film spreading ahead of the bulk of drop plays an important role. The bulk drop undergoes a hydraulic jump as its flow is arrested at the pinning edge defined by a lip member of the reentrant structure, and subsequently coalesces with the precursor film thus re-initiating its spreading until the next pinning edge is reached.

FIG. 1E is a graph showing the time-dependent spreading length normalized by a characteristic geometric length $(\Omega/b)^{0.5}$ of the spreading droplet, where $\Omega$ is the volume of the droplet and b is its lateral width. With a modest dynamic range of data spanning over three decades, two different spreading regimes can be clearly identified. Initially, the spreading length increases almost linearly with time, suggesting that the velocity of the droplet remains more or less constant signifying a unique characteristic of the designed liquid diode. In the linear growth regime, the higher viscosity droplet spreads more slowly than a relatively inviscid droplet.

FIG. 1F illustrates a non-dimensionalization of the experimental spreading time with an intrinsic visco-capillary time scale $\tau=\mu b/\gamma$ brings the scattered data for various liquids quite close to each other, which leads to state that the scaling $L_s/(\Omega/b)^{0.5} \sim t/\tau$ capturing the essential physics of the unidirectional spreading behavior of the droplet during the initial stage. In FIG. 1F, the droplet in the later stage exhibits a logarithmic slowing-down kinetics as evidenced in the semi-log plot of $1-L_s/L_{sm}$ versus $t/\tau$ (inset), where $L_{sm}$ is the maximum spreading length. At the later stage, the spreading exhibits a logarithmically slowing-down kinetics as evidenced in the semi-log plot of $1-L_s/L_{sm}$ versus $t/\tau$. Please see inset in FIG. 1F). It is to be noted that $L_{sm}$ is the maximum spreading length. Such a weaker temporal evolution of its spreading length departs from the classical slowing-down behavior, reminiscent of various processes in nature, such as the time evolution of frictional strength, compactification of grains, magnetization relaxation in spin glasses, conductance relaxations and diffusion under a random force. The above illustrations are applicable to liquid transport of a slowly spreading silicone fluid on such a substrate structure. It is demonstrated that a visually perceptible thin liquid film continues to spread ahead of the primary droplet.

Figures 2A, 2B, 2C, 2D:
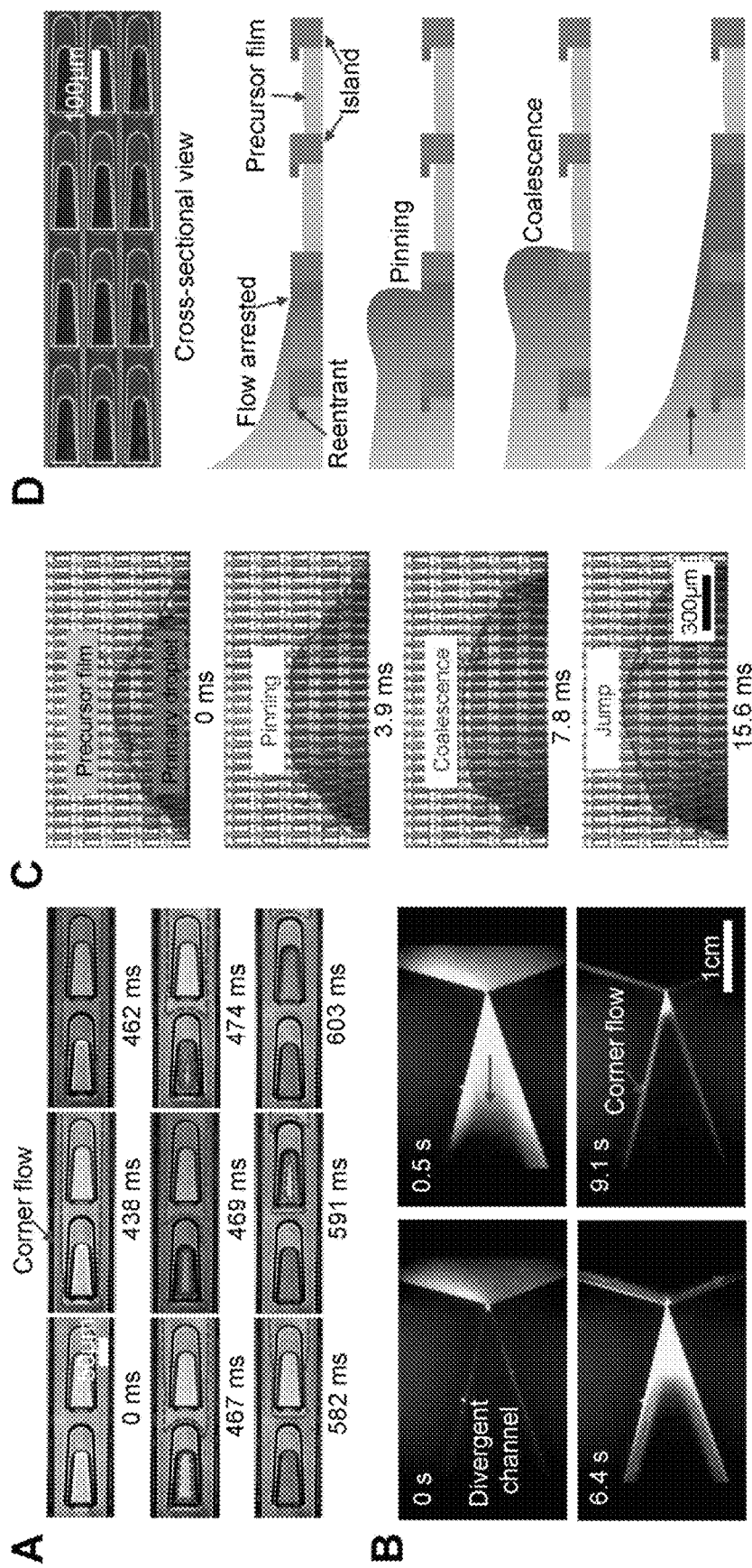

FIG. 2A presents time-resolved wetting dynamics of the advancing precursor liquid in two periodic units of the structure that displays the diode like effect. Initially, the precursor liquid preferentially wets the straight sidewall of side-channels (0-400 ms). Upon contact with the sidewall of U-shaped islands (428 ms), it progresses spontaneously in the side-channels, with a spreading velocity 2.8-fold larger than that of the primary droplet. Subsequently, the reentrant cavity and asperities between two neighboring U-shaped islands become wetted, triggering a global propagation of liquid and characteristic of a domino effect.

It is to be noted that what appears to be a precursor film is, in fact, a consequence of a Concus-Finn type corner flow that is generic to two wettable surfaces producing a corner. In the liquid diode structure, such a flow manifests in the form of thin liquid threads with a smoothly varying curvature spreading along the side fences and then distributing to other available corners. The role of corner flow in dragging a liquid in a diverging channel can be easily demonstrated by placing a small droplet of water near the narrow gap of two slightly non-parallel glass slides, as shown in FIG. 2B. In FIG. 2B, two diverging channels using two non-parallel glass slides were created. As a water droplet containing 0.1 μm fluorescent particles is placed in the mouth of a channel (0 s), the liquid flows fast along all the available corners (indicated by the red arrow), and fills partially the entrance region of the channel. However, as flow continues along the corners, this accumulated liquid is depleted, indicating the role of the corner flow on the liquid transport.

Upon invading the diverging channel through the narrow gap, water fills it up rather fast. However, as the liquid continues to spread along all the four corners of this structure, it is eventually depleted, illustrating that the pressure gradient in the liquid along the corners is stronger than the Laplace pressure gradient that is produced across the concave meniscus of the liquid joining the two walls of a diverging channel.

To elucidate how the corner flow in the precursor regulates the unusual uni-directional spreading behavior, further analysis was conducted on the local contact line dynamics of the primary droplet. It was identified that the advancing edge of the primary droplet does not move continuously. Instead, it stops for a brief period during which the precursor film continues to flow. When the bulk flow of the liquid drop is suddenly arrested, Bernoulli's equation suggests that the conserved energy of the liquid has to be converted to another form of energy. This happens in the context of the present invention with the liquid bulging up near the arrested edge. Please see the semi-circular edge in FIG. 2C. (Referring to FIG. 2C, as the precursor film continues to flow ahead of the primary droplet, the spreading liquid accumulates to form a nearly straight wetting front as a result of contact line pinning of the advancing edge (3.9 ms). Subsequently, the primary droplet coalesces with the precursor film and the straight edge eventually jumps like an avalanche (7.8 and 15.6 ms), resulting in a fast forward flow.) At the time when the liquid bulges up near the arrested edge, a larger surface area is created, and, consequently, more surface free energy is created. This bulging up leads to a hydraulic jump, resulting in an increase of the local contact angle. The pinned edge moves forward when the local contact angle tends to increase above a certain critical value dictated by the intrinsic contact angle and the slope of pinning edge.

Referring to FIG. 2D, as different segments of the pinned edge are successively de-pinned, a nearly straight frontal edge is formed, following which, the entire liquid front jumps forward like an avalanche. (In FIG. 2D, the area in green corresponds to the reentrant structure.) Since the advancing edge relaxes from a semi-circle of diameter~b, the characteristic time scale of this process can be written as $\tau=\mu b/\gamma$. For a droplet with a constant volume ($\Omega$) and a lateral spreading width b, the intrinsic length of spreading is $(\Omega/b)^{0.5}$. Thus, the scaling for the spreading distance in the fast spreading regime becomes $L_s/(\Omega/b)^{0.5} \sim t/\tau$, which is indeed consistent with the results summarized in FIG. 1F. In summary, it is shown that the hydraulic jump rendered by the corner flow provides a unique mechanism for the droplet to overcome the contact line pinning in the preferential flow direction.

Figures 3A, 3B, 3C, 3D, 3E, 3F:
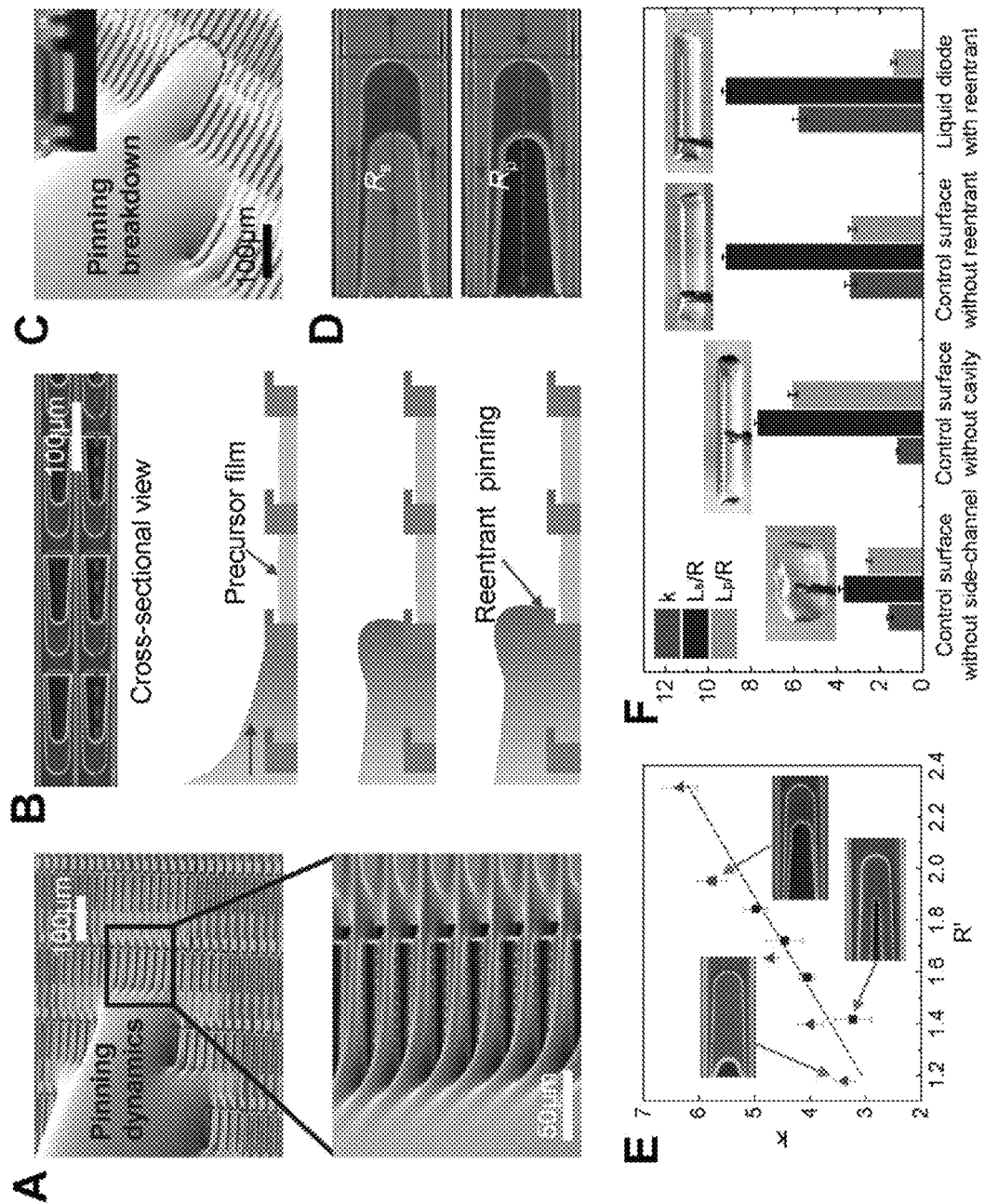

Despite the corner flow and hydraulic jump, the back flow of the liquid droplet is strongly thwarted around the reentrant edge as evidenced by the SEM image of the contact line in FIG. 3A. (In FIG. 3A, the red lines in the magnified SEM image denote the pinning of the liquid at the reentrant edge.)

FIG. 3B shows the presence of unique reentrant structure gives rise to an upward capillary force to resist the liquid penetration into the cavity. Here, in conjunction with the concave meniscus in the diverging channel, the advancing edge in the primary droplet fails to coalesce with the precursor liquid. Such a pinning is also assisted kinetically by the continual removal of liquid through the corner flow in the diverging channel, as the curvature of the liquid meniscus becomes progressively concave starting from the mouth of the diverging channel towards its tail. Collectively, these two effects nullify the possibility of the droplet relaxing from the pinned edge.

Referring to the FIG. 3C, for the surface without the presence of reentrant structure (inset of FIG. 3C), the advancing liquid in the pinning direction easily penetrates the cavity and the pinning effect is broken down, as depicted by the continuous advancing edge shown in FIG. 3C. From FIG. C, it is demonstrated that the advancing liquid penetrates the cavity and the pinning effect is collapsed as depicted by the red dashed line. The inset shows the side-view of the cavity with a straight sidewall. In summary, the spreading droplet can only flow in one, but not its reverse, direction.

Referring to FIG. 3D, the decoupling of the side-channels responsible for the corner flow from the reentrant cavities responsible for the pinning of back flow creates distinct hydrodynamic flow resistances in the spreading and pinning directions, respectively. In FIG. 3D, In the spreading direction, the fluid propagates along both side-channels and cavities. By contrast, in the reverse direction, the pathway is confined to side-channels alone due to the reasons discussed above. When the droplet spreading comes to a complete halt, an interesting relation emerges, which connects the asymmetric spreading lengths to the hydraulic flow resistances in two directions. Such a unique relation arises from the fact that the rate of the decay of the droplet volume is exactly the same as that carried outward by the precursor films in two opposite directions. The flow in the precursor film is mainly driven by the negative pressure $(-P^*)$ in the precursor film, $-P^* \sim R_s Q_s \sim R_p Q_p$, where R, and $Q_i = bL_i(dh/dt)$ being the hydrodynamic flow resistance and the volumetric flow rate in the spreading (i=s) or the pinned (i=p) direction. Combining these two conditions, we have $R_s L_s \sim R_p L_p$ and hence $k \sim R_p/R_s$. On the other hand, the hydraulic flow resistance in the reverse direction relative to that in the spreading direction can be written as $R' = R_p/R_s = 1 + R_{side}/2R_{cavity}$, where $R_{side}$ and $R_{cavity}$ are the hydraulic resistances in the side-channel and cavity, respectively. In conformity with the above scenario, we find that the rectification coefficient is indeed linearly proportional to R'. Please see 3E. In FIG. 3E, the R' can be tailored by varying sizes in the cavity length or width. The red triangular symbols indicate a series of surfaces with increasing cavity length (l/L=⅙, ⅓, ½, ⅔ and ⅚), but constant width (d/D=⅗). The blue rectangular symbols indicate a series of surfaces with increasing cavity width (d/D=⅕, 3/10, ⅖, ½ and ⅗), but constant length (l/L=⅔). Thus, tailoring the feature size of cavity alone allows the regulation of the rectification coefficient in the liquid diode without compromising the fast and spontaneous liquid transport in the side-channels. Here, the R' can be tailored by varying sizes in the cavity length or width. The red triangular symbols indicate a series of surfaces with increasing cavity length (l/L=⅙, ⅓, ½, ⅔ and ⅚), but constant width (d/D=⅗) as shown in Table S2 and FIGS. 12A to 12D. The blue rectangular symbols indicate a series of surfaces with increasing cavity width (d/D=⅕, 3/10, ⅖, ½ and ⅗), but constant length (l/L=⅔).

To ascertain how the preferential motion of droplet is mediated by structural topography, control surfaces without the presence of side-channel, cavity or reentrant structure were also designed and fabricated. Please see FIG. 3F. The blue and green symbols indicate the spreading lengths normalized by the droplet radius at the spreading direction and pinning direction, respectively. The red symbol denotes the rectification coefficient (k) on different designs. The inset images present the optical image of spreading drops on the respective surfaces.

The results show that the manifestation of superior diode-like behavior demands the delicate control over the diverging channel, cavity as well as reentrant structure. Briefly, with the obstruction of the side-channel or the cavity, both the spreading length of droplet and rectification coefficient are markedly reduced. Please see FIG. 3F. For the control surface without the presence of side-channels, the droplet displays an almost symmetric spreading with a short spreading distance in all directions. This result suggests that corner flow serves as energetically favorable pathways to guide the lateral liquid flow. Indeed, for the control surface in which the cavity is obstructed, the droplet spreading is spatially confined in the lateral direction. However, in this case, the rectification coefficient is the smallest (see FIG. 3F), suggesting that the cavity structure is essential to the rectification of directional flow. Moreover, without the presence of reentrant structure in the cavity (see FIG. 14C), the rectification coefficient is reduced by about 40% (see FIG. 3F). Taken together, these results convincingly reveal that the exquisite integration of diverging side-channels (corner flow) and reentrant in one structure (hydraulic jump and reentrant pinning) is indispensable for the directional and fast liquid transport.

To illustrate the advantages of the liquid diode in accordance with the present invention, in FIG. 4A the unidirectional spreading velocity and the range of transport with reported surfaces are benched. Green area and blue area indicate the surfaces with wettability gradients and asymmetric geometries, respectively. The red triangular symbol denotes the unidirectional liquid transport on the nature peristome of Pitcher plant, and the red circular symbol represents the as-designed liquid diode.

Surfaces with an imposed wetting gradient are associated with a large motion velocity (green area in FIG. 4A) and a short spreading distance owing to the inherent tradeoff in satisfying these two exclusive parameters. On the other hand, asymmetrically structured surfaces enable a long range of liquid self-transport, but with a small velocity (blue area in FIG. 4A). We also demonstrate that the intriguing liquid transport on the as-designed liquid diode is general. As shown in FIG. 4B, the liquid can be transported along various pathways such as rings, circle and can climb up-hill without the use of gravity or other gradient. Second, as shown in FIG. 4C, the uni-directional liquid transport is further enhanced when there is a gradual temperature gradient along the spreading direction. When the temperature gradient is applied against the spreading direction, there is only a slight decrease in the rectification coefficient, suggesting the stability of the directional transport even when subject to an externally applied temperature field. Such a capability holds many potential applications such as in heat pipes. Finally, the directional droplet transport applies to any liquid including low surface tension liquid such as hexane (~18.4 mN/m), and high viscosity liquid such as ethylene glycol (~16.06 mPa·s). Please see FIG. 4D. FIG. 4D shows the liquid diode exhibiting high rectification coefficient for low-surface-tension liquid, such as hexane, and high-viscosity liquid, such as ethylene glycol. The high viscosity liquid (ethylene glycol), however, displays the counter-intuitive behavior that its rectification coefficient is higher than that of water.

The criterion of rectification as discussed above is on uniform reduction in the thickness of the bulk of the liquid when spreading comes to a complete halt. With more viscous liquid, the rate of thinning of the liquid film in the bulk of the droplet should be spatially uneven, as another resistance corresponding to the horizontal internal flow of the liquid drop needs to be considered. While a rigorous solution of this problem requires a full consideration of the "so-called" thin film equation, the bulk flow of the liquid appears to occur (internally) from the pinned to the spreading direction of the drop, such that $$\frac{dh_p}{dt} > \frac{dh_s}{dt}.$$

Since the rectification coefficient would be of the form:

$$k = \left(R_p \frac{dh_p}{dt}\right) \bigg/ \left(R_s \frac{dh_s}{dt}\right),$$

k is expected to increase for a viscous liquid in comparison to that of a more inviscid liquid. Please see FIG. 4D.

Taken together, the ease of fabrication, the generality as well as the intriguing transport performances of the liquid diode according to the present invention opens up new avenues to tailor advanced microstructures for self-propelled liquid manipulation in a variety of applications, including water harvesting, heat management, ink-jet printing, and emulsion separation.

Materials and Methods

Sample Fabrication

Standard MEMS processes were used to fabricate the liquid diode based on silicon wafer ((100) type, 420±5 μm thick). To form side-channels, photolithography process was used to deposit a layer of photoresist as a protective mask, followed by anisotropic etching (~5 μm deep) using deep reactive ion etching (DRIE). Subsequently, plasma strip and wet cleaning were performed to remove the photoresist. To fabricate the cavities with reentrant structure, we used thermal oxidization to deposit a layer of $SiO_2$ with a thickness of 1 μm on the silicon wafer, followed by photolithographic patterning and selective removal of $SiO_2$ layer using reactive ion etching (RIE). The silicon exposed at the cavity structure was isotropically etched (~5 μm deep) by DRIE or $XeF_2$. After final wet cleaning treatment, the liquid diode with reentrant structure was formed.

To investigate the effect of surface topography on the liquid diode behavior, a series of surfaces with varying sizes in cavity structure and side-channels, as well as control surfaces without the design of cavity, re-entrant, or side-channel, were fabricated. The control surface without the design of cavity structure was fabricated with the first three steps of the process described above. The procedure to fabricate the control surface without the reentrant structure is basically the same as that developed for the fabrication of the liquid diode with reentrant feature, except that the Si was anisotropically etched to form the cavity with straight sidewall. The control surface without side-channel was fabricated using the same procedure as developed for the liquid diode surface, except that the masks for photolithography in the first step were different. Compared to the liquid diode surface, the side-channel was blocked on the control surface without the design of side-channel. Liquid diodes with spiral or circular pathways to demonstrate the generality of the directional transport were also generated. To fabricate the curved pathways, we divided the surfaces into a variety of parts, and each part was fabricated by the procedures developed for the liquid diode surface with the reentrant structure. It is to be noted that due to the existence of defects between neighboring parts, the flow widened slightly during the directional liquid transport on the surface with spiral or circular pathways.

Surface Treatment and Contact Angle Measurement

The as-fabricated surfaces as well as the flat silicon substrate were treated with Plasma Cleaner PDC-32G (Harrick Plasma limited.) at high RF level for ~90 s to obtain hydrophilic surfaces. To quantify how the intrinsic wettability affects the droplet spreading behavior, the intrinsic contact angle on the flat surface using a contact angle goniometer (ramé-hart M200 Standard Contact Angle Goniometer) was measured. At room temperature with 50% relative humidity, deionized water droplet of ~3 μl was deposited on the tested substrates at a volume rate of 1 μL/s. The contact angle was measured every 10 minutes for a total of one hour to evaluate the variation of contact angle. The apparent contact angle on the flat wafer surface within an hour remains 14.7°0±3.3°. These values are the average of five measurements.

Characterization of Macroscopic Transport Behavior of Liquid Diode

We carried out the unidirectional spreading experiment on the as-fabricated liquid diode and control surfaces at room temperature. The liquid droplet was generated with a stainless steel needle having an outer diameter 0.5 mm, which was connected to a syringe pump. The spreading dynamics was recorded from the plan view by a high speed camera (Fastcam SA4, Photron limited). Next, in order to demonstrate the generality of the directional transport, we performed liquid transport experiments on the liquid diode surfaces with circular and spiral pathways, in which the water was continuously infused on these surfaces. Finally, four other liquids were also used to demonstrate the generality of the directional liquid transport.

Characterization of Microscopic Transport Behavior of Liquid Diode

To improve the visual clarity and the spatial resolution of water spreading on the liquid diode, we stained the deionized water (about 1 μL) with a blue dye. The spreading dynamics on liquid diode was observed with an Olympus BX60 Microscope connected to a high speed camera. To examine the pinning dynamics on the liquid diode and the control surface without reentrant structure, we used a long working distance microscope equipped with high speed camera.

Technically, it is extremely challenging to capture the pinning profiles induced by the reentrant structure because the deionized water easily evaporates in the vacuum chamber of a Scanning Electron Microscope (SEM). To overcome this issue, uncured polydimethylsiloxane (PDMS) was used to replace water. PMDS liquid was first deposited on the liquid diode surface and then immediately heated it at 100° C. for ~40 min. After a layer of silver was plated on the tested surfaces by sputtering machine, the pinning morphology under SEM was characterized. Likewise, this method was used to characterize the collapse of pinning effect on the control surface without the presence of reentrant structure.
Effect of Temperature Gradient on the Directional Transport To examine the stability of directional, spontaneous transport manifested by the liquid diode, an additional temperature gradient was imposed. Briefly, one end of the liquid diode surface was fixed onto a heater and the other end was exposed to air. The distribution of temperature was measured using an infrared camera with a 13 mm lens. Simultaneously, the spreading dynamics of liquid was recorded with a high speed camera.

Supplementary Description

Figures 5A, 5B, 5C, 5D:
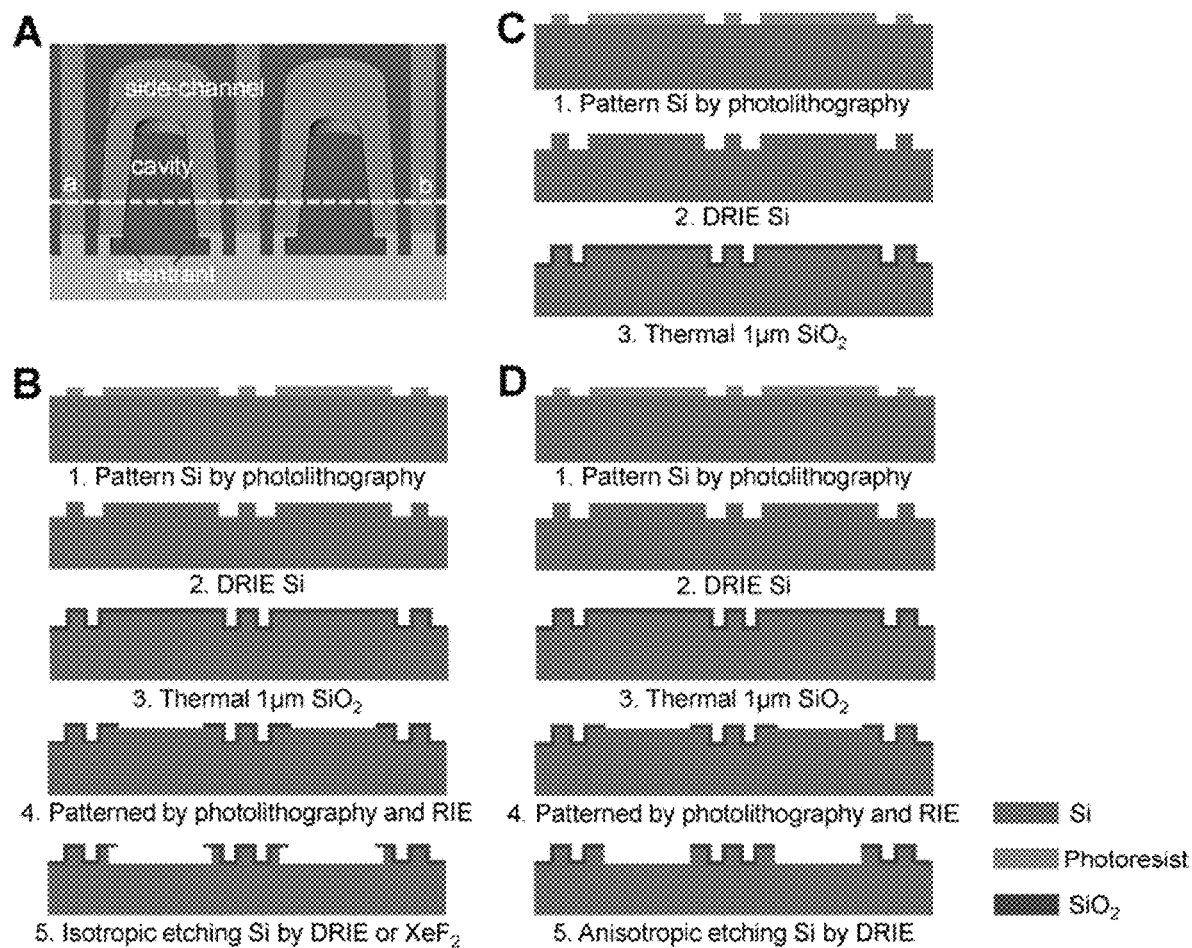
FIGS. 5A to 5D are representations showing steps of fabrication of a liquid diode in accordance with the present invention.

Further description of fabrication of a liquid diode in accordance with the present invention is set out as follows.
1. Sample Fabrication FIG. 5A presents the schematic diagram of the liquid diode, which consists of three main components as described in the text (side-channel, cavity, and reentrant). The yellow dashed line indicates the cross-section view to display the fabrication procedures. The structural parameters of all the surfaces are shown in below Table 1.
Liquid Diode with Reentrant Structure:

FIG. 5B shows process flow to fabricate the liquid diode. Standard MEMS processes were used to fabricate the liquid diode based on silicon wafer (100) type, 420±5 μm thick). To form side-channels, the photolithography process was used to deposit a layer of photoresist as a protective mask, followed by anisotropic etching (~5 μm deep) using deep reactive ion etching (DRIE) method. Then plasma strip and wet cleaning were performed to remove the photoresist. To fabricate the cavities with reentrant structure, we used the thermal oxidization to deposit a layer of $SiO_2$ with a thickness of 1 μm on the silicon wafer, followed by photolithographic patterning and selective removal of $SiO_2$ layer using reactive ion etching (RIE). The silicon exposed at the cavity structure was isotropically etched (~5 μm deep) by DRIE or $XeF_2$. After final wet cleaning treatment, the liquid diode with reentrant structure was formed. To investigate the effect of surface topography on the liquid diode behavior, a series of surfaces was fabricated with varying sizes in cavity structure and side-channels as shown in Tables 2 and 3.
Control Surface without the Design of Cavity:

FIG. 5C shows Process flow to fabricate the control surface without the presence of cavity. The control surface without the design of cavity structure was fabricated with the first three steps of the process described above.
Control Surface without the Design of Reentrant Structure (FIG. 5D):

FIG. 5D shows a process flowchart to fabricate the control surface without the presence of reentrant structure. The gray area, green area, and red area indicate Si, photoresist and $SiO_2$, respectively. The procedure to fabricate the control surface without the reentrant structure is basically the same as that developed for the fabrication of the liquid diode with reentrant feature, except that the Si was anisotropically etched to form the cavity with straight sidewall.
Control Surface without the Design of Side-Channel (FIG. 5B):

The control surface without side-channel was fabricated using the same procedure as developed for the liquid diode surface, except that the masks for photolithography in the first step were different. Compared to the liquid diode surface, the side-channel was blocked on the control surface without the design of side-channel.

Liquid Diodes with Spiral or Circular Pathways:

Liquid diodes with spiral or circular pathways were constructed to demonstrate the generality of the directional transport. To fabricate the curved pathways, the surfaces were divided into a variety of parts, and each part was fabricated by the procedures developed for the liquid diode surface with the reentrant structure. Note that owing to the existence of defects between neighboring parts, the flow widened slightly during the directional liquid transport on the surface with spiral or circular pathways.

TABLE 1

Structural parameters of the liquid diode and control surfaces.

| | Features | | | |
|---|---|---|---|---|
| Samples | s (μm) | d (μm) | l (μm) | Reentrant length (μm) |
| Liquid diode with reentrant | 5 | 30 | 100 | 5 |
| Control surface without side-channel | 0 | 30 | 100 | 5 |
| Control surface without cavity | 5 | 0 | 0 | 0 |
| Control surface without reentrant | 5 | 30 | 100 | 0 |

Note:
All the surfaces have same structural parameters L~150 μm, D~50 μm and α~2.2°.

TABLE 2

Structural parameters of liquid diodes with varying sizes in cavity length

| | Features | | | |
|---|---|---|---|---|
| Samples | s (μm) | d (μm) | l (μm) | Reentrant length (μm) |
| 1 | 5 | 30 | 25 | 5 |
| 2 | 5 | 30 | 50 | 5 |
| 3 | 5 | 30 | 75 | 5 |
| 4 | 5 | 30 | 100 | 5 |
| 5 | 5 | 30 | 125 | 5 |

Note:
All the surfaces have same structural parameters L~150 μm, D~50 μm and α~2.2°.

TABLE 3

Structural parameters of liquid diodes with varying sizes in cavity width

| | Features | | | |
|---|---|---|---|---|
| Samples | s (μm) | d (μm) | l (μm) | Reentrant length (μm) |
| 1 | 5 | 10 | 100 | 5 |
| 2 | 5 | 15 | 100 | 5 |
| 3 | 5 | 20 | 100 | 5 |
| 4 | 5 | 25 | 100 | 5 |
| 5 | 5 | 30 | 100 | 5 |

Note:
All the surfaces have same structural parameters L~150 μm, D~50 μm and α~2.2°.

2. Surface Treatment and Contact Angle Measurement

The as-fabricated surfaces as well as the flat silicon substrate were treated with Plasma Cleaner PDC-32G (Harrick Plasma limited.) at high RF level for ~90 s to obtain a hydrophilic property. To quantify how the intrinsic wettability affects the droplet spreading behavior, we measured the intrinsic contact angle on the flat surface by a contact angle goniometer (ramé-hart M200 Standard Contact Angle Goniometer). At room temperature with 50% relative humidity, deionized water droplet of ~3 µl was deposited on the tested substrates at a volume rate of 1 µL/s. The contact angle measurement was performed every 10 minutes for a total of one hour to evaluate the variation of contact angle. The apparent contact angle on the flat wafer surface within an hour remains 14.7°±3.3°. These values are the average of five measurements.

3. Characterization of Macroscopic Transport Behavior of Liquid Diode

The unidirectional spreading experiment was carried out on the as-fabricated liquid diode and control surfaces at room temperature. Please see FIG. 1D. The liquid droplet was generated with a stainless steel needle having an outer diameter 0.5 mm, which was connected to a syringe pump. The spreading dynamics was recorded from the plan view by a high speed camera (Fastcam SA4, Photron limited). Next, in order to demonstrate the generality of the directional transport, liquid transport experiments were performed on the liquid diode surfaces with circular and spiral pathways, in which the water was continuously infused on these surfaces. Please see FIG. 4B. Finally, four other liquids (Table 4) were also used to demonstrate the generality of the directional liquid transport. Please also see FIGS. 1E, 1F and 4D.

TABLE 4

Physical and chemical properties of tested liquids

| Liquids | Chemical formula | Surface tension (mN/m) | Viscosity (mPa · s) | Density (kg/m³) |
|---|---|---|---|---|
| Hexane | $C_6H_{14}$ | 18.4 | 0.3 | 660.6 |
| 2-Propanol | $C_3H_8O$ | 21.2 | 2.04 | 780.9 |
| Ethanol | $C_2H_6O$ | 22.3 | 1.074 | 789 |
| Ethylene glycol | $C_2H_6O_2$ | 48.2 | 16.06 | 1113.5 |
| Deionized Water | $H_2O$ | 72.8 | 0.89 | 997 |

Note:
Properties are collected at 20° C. and from CRC reference source.

4. Characterization of Microscopic Transport Behavior of Liquid Diode

To improve the visual clarity and the spatial resolution of water spreading on the liquid diode, the deionized water (about 1 µL) was stained with a blue dye. The spreading dynamics on liquid diode was observed with an Olympus BX60 Microscope connected to a high speed camera. Please see FIGS. 2A and 2C. To examine the pinning dynamics on the liquid diode and the control surface without reentrant structure, we used a long working distance microscope equipped with high speed camera.

Technically, it is challenging to capture the pinning profiles induced by the reentrant structure because the deionized water easily evaporates in the vacuum chamber of Scanning Electron Microscope (SEM). To overcome this issue, uncured polydimethylsiloxane (PDMS) was used to replace water. PMDS liquid was deposited on the liquid diode surface and then immediately heated it at 100° C. for ~40 min. After a layer of silver was plated on the tested surfaces by sputtering machine, the pinning morphology was characterized under SEM. Please see FIG. 3A. Likewise, this method was used to characterize the collapse of pinning effect on the control surface without the presence of reentrant structure. Please see FIG. 3C.

5. Effect of Temperature Gradient on the Directional Transport

To examine the stability of directional, spontaneous transport manifested by the liquid diode, an additional temperature gradient was imposed. Please see FIG. 4C. Briefly, one end of the liquid diode surface was fixed onto a heater and the other end was exposed to air. The distribution of temperature was measured using the infrared camera with 13 mm lens. Meanwhile the spreading dynamics of liquid was recorded with a high speed camera.

Figure 6:
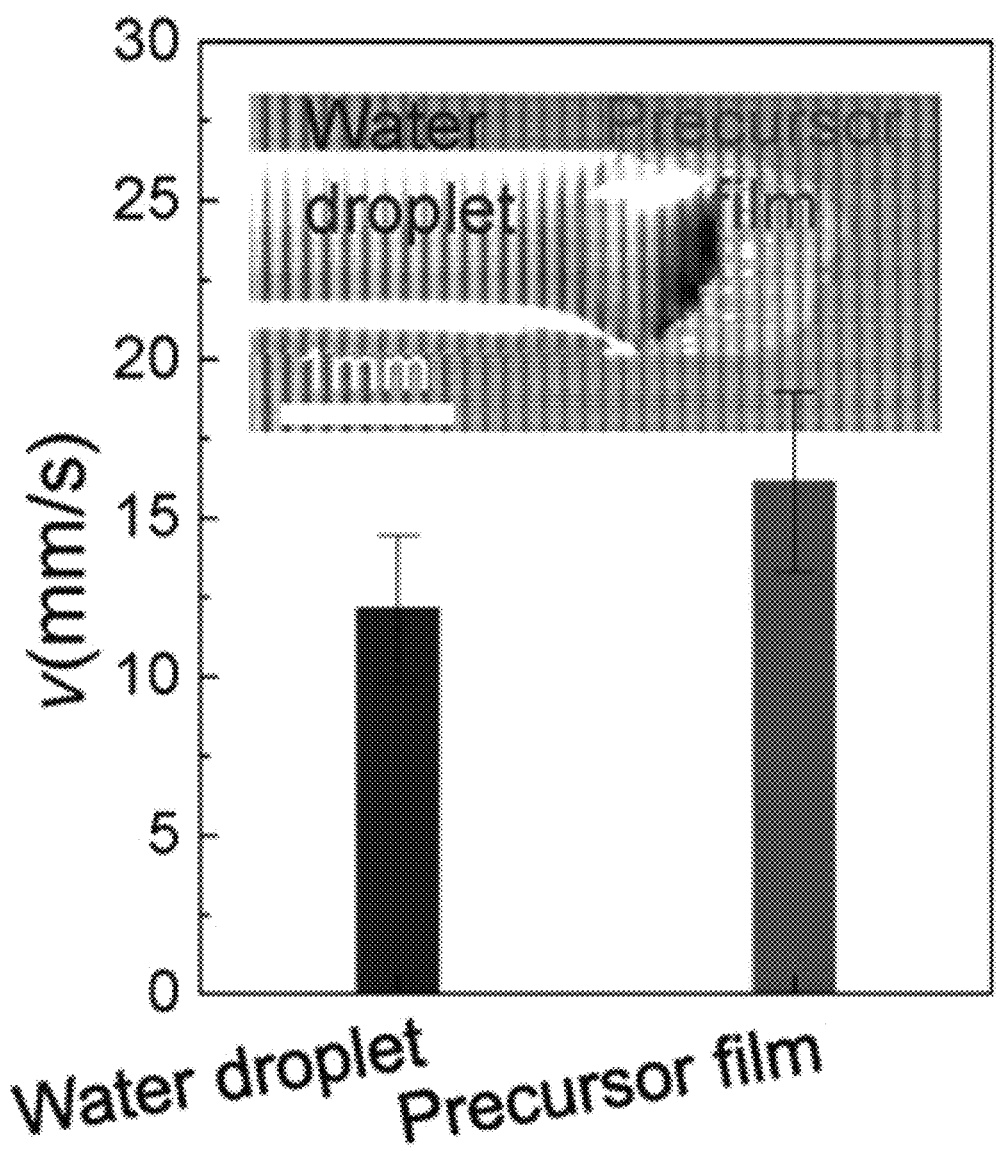
FIG. 6 is a representation of characterization of precursor film and water droplet spreading velocity.

5.1 Characterization of Microscopic Spreading Behavior of the Precursor on Liquid Diodes Referring to FIG. 6, during the unidirectional spreading process, there is a layer of precursor film preceding the entire water droplet. The inset image presents the selected snapshot of advancing precursor film followed by the entire water droplet.

Figure 7:
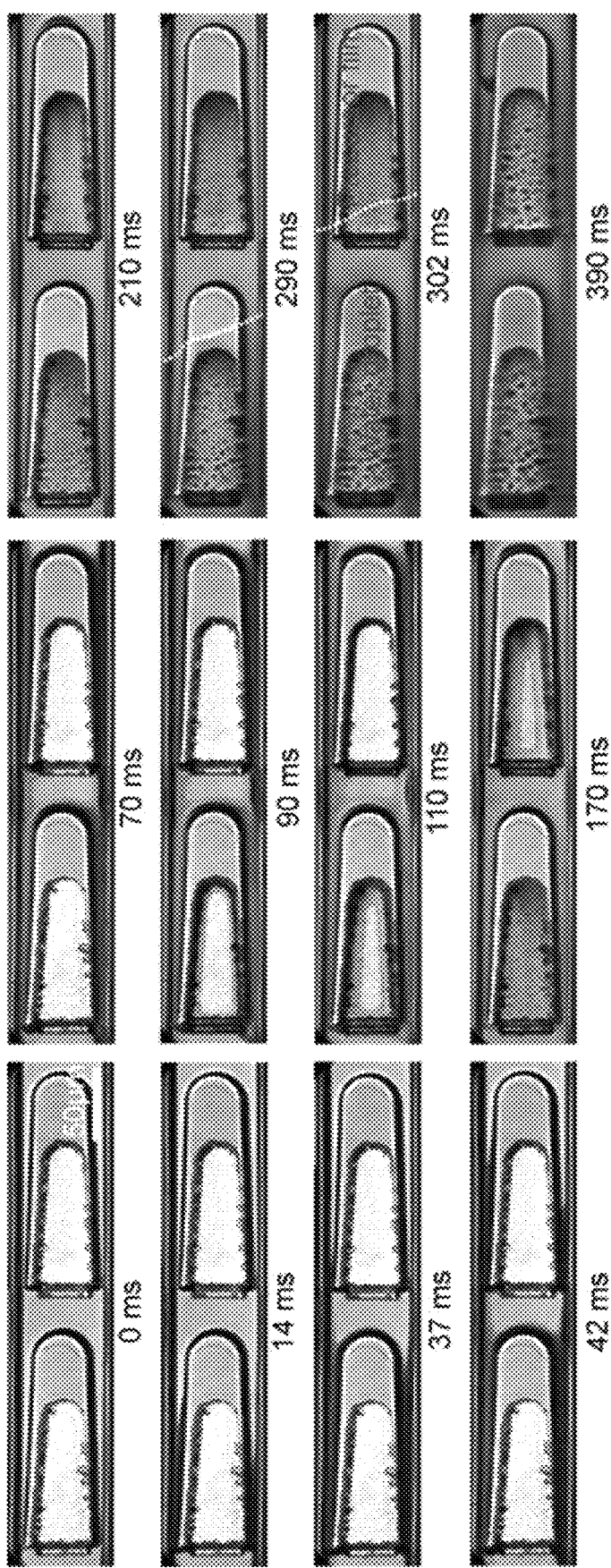
FIG. 7 are snapshots showing the microscopic wetting dynamics on liquid diode.

Referring to FIG. 7, when the opening width of the side channel decreases to s~5 µm, the liquid filaments immediately fill the divergent side-channel (from 0 ms to 70 ms) that subsequently fill the cavities. After 210 ms, the advancing precursor precedes the entire water droplet. Here, the white dashed lines denote the moving front of the entire droplet.

Figure 8:
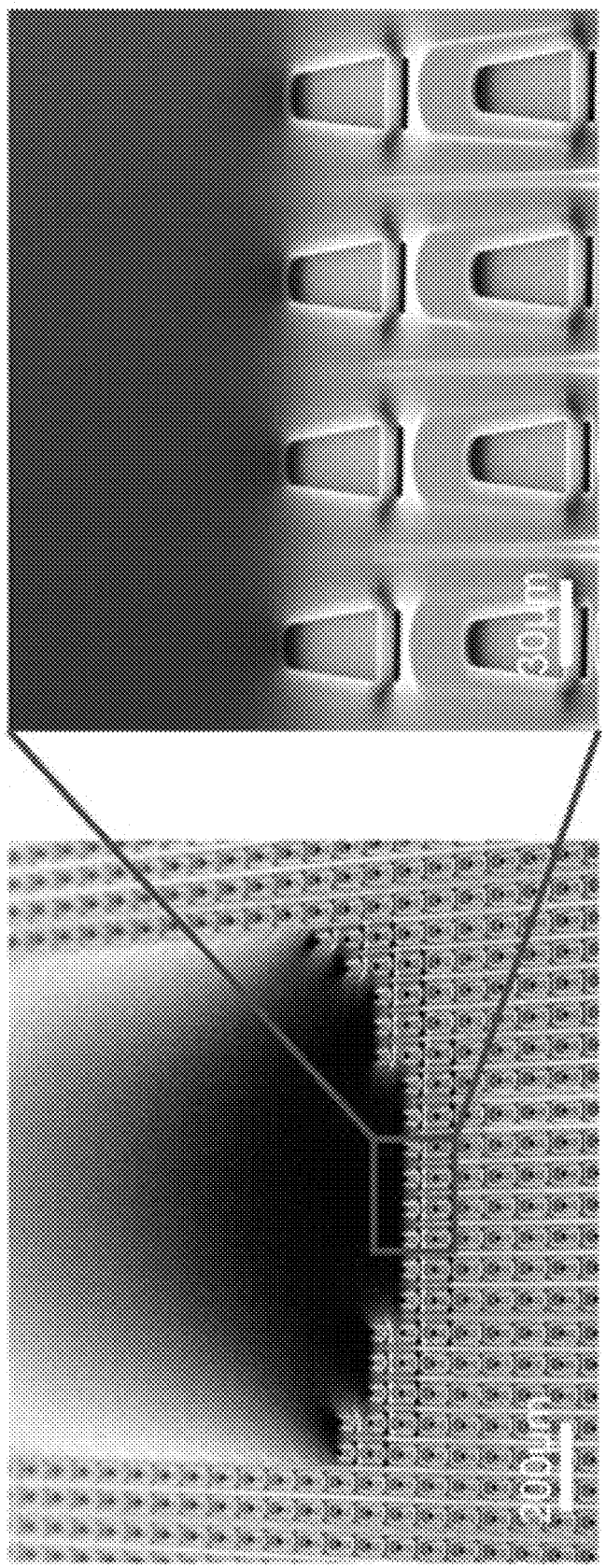
FIG. 8 includes representative SEM images showing the liquid pinning rendered by the reentrant structure.

Referring to FIG. 8, from the top-view image captured, it is clear that the cured PDMS is stably immobilized around the edge of cavity owing to the pinning effect enabled by the reentrant structure.

Figure 9:
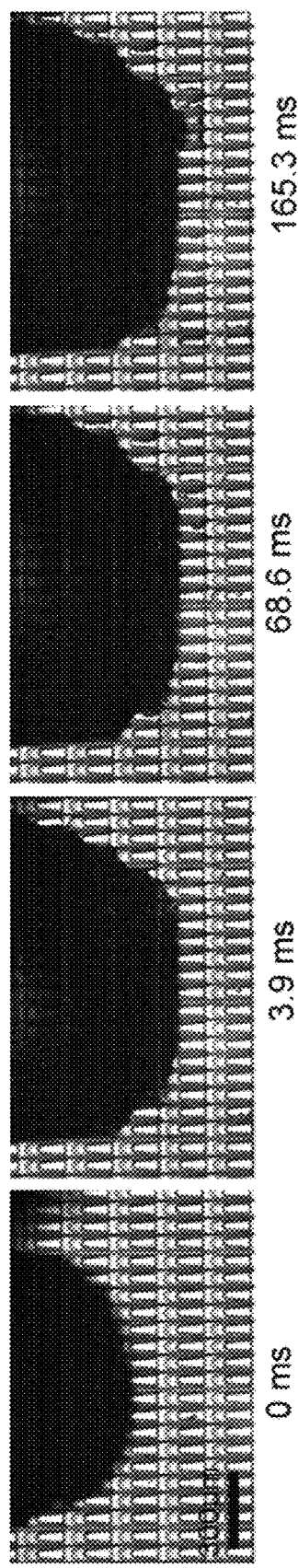
FIG. 9 are selected snapshots showing the pinning dynamics of water on liquid diode.

Referring to FIG. 9, the presence of reentrant structure distorts the curvature of the spreading liquid, preventing it from penetrating into the downsides of cavity. Although the droplet also spreads slightly towards the direction against the opening of the cavities, the spreading in the reverse direction is arrested and eventually displays a unidirectional flow along the preferential direction.

Figure 10:
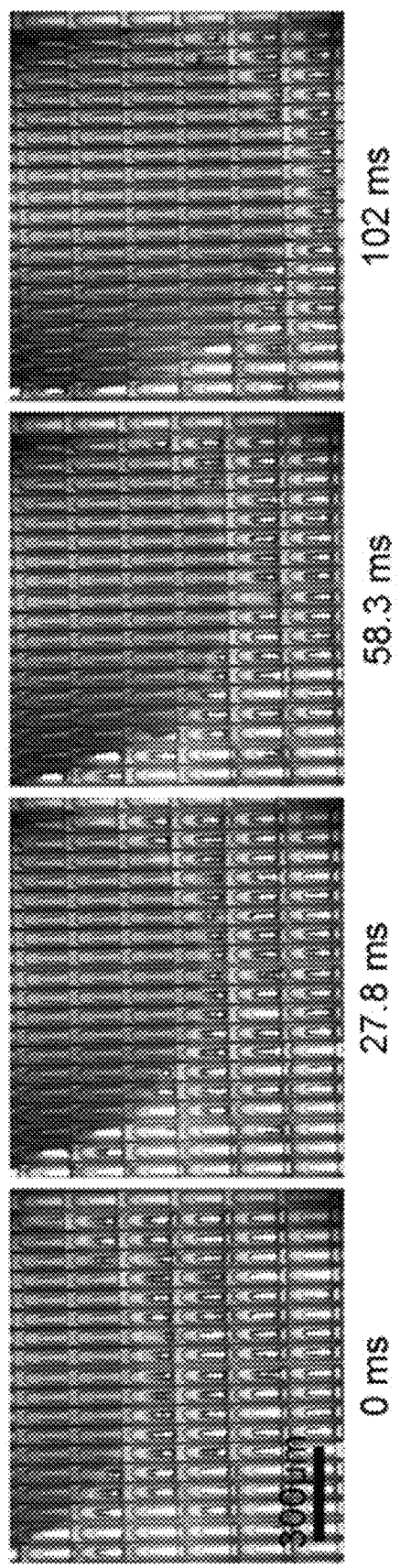
FIG. 10 are selected snapshots showing the breakdown of pinning on control surface without the presence of reentrant feature.

Referring to FIG. 10, due to absence of reentrant structure around the edge of cavities, the fluid easily wets the vertical wall of the hydrophilic cavity, and exhibits a smaller asymmetric spreading in the lateral direction.

5.2 Flow Hydraulic Resistance Analysis

To build the link between surface topography and liquid diode transport behavior, we developed a theoretical model based on the flow hydraulic resistance. We first assumed that the flow in the rectangular microchannel is fully developed. Under this condition, the hydraulic resistance in the microchannel with rectangular cross-section (width w, height h and length l) can be expressed as (1, 2).

$$R_{hyd} = \frac{12 \mu l}{wh^3}\left(1 - \frac{192 h \Sigma}{\pi^5 w}\right)^{-1} \tag{S1}$$

$$\text{where } \Sigma = \sum_{i=1,3,5,...}^{\infty} \tanh(i\pi w/2h)/i^5.$$

Consider two straight channels that are connected in parallel. The hydraulic resistance across the parallel channels $R_{parallel}$ can be characterized as (3)

$$R_{parallel} = (1/R_1 + 1/R_2)^{-1} \tag{S2}$$

where $R_1$ and $R_2$ are the hydraulic resistances in two parallel channels, respectively. However, in the case of the serial coupling, the coupling hydraulic resistance $R_{series}$ is calculated as (3)

$$R_{series} = R_1 + R_2 \tag{S3}$$

where $R_1$ and $R_2$ are the hydraulic resistances in two serial channels, respectively. Along the preferential direction, the liquid spreads across two side-channels and asymmetric cavity. The hydraulic resistance along the preferential direction is expressed as $$R_s = (2/R_{side} + 1/R_{cavity})^{-1} \tag{S4}$$

Along the pinning direction, however, the pathway is confined to side-channels alone owing to the presence of reentrant structure, which gives rise to a large breakthrough pressure for the liquid to penetrate. So the hydraulic resistance along the pinning direction is calculated as $$R_p \times R_{side}/2 \tag{S5}$$

Figures 11A, 11B:
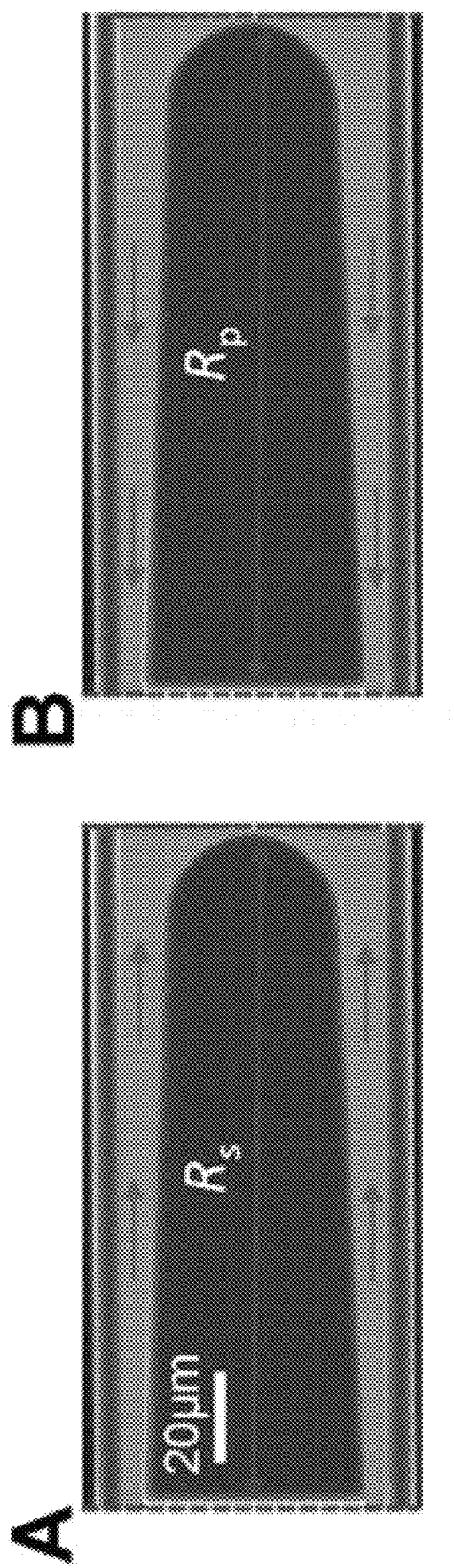
FIGS. 11A to 11B are schematic diagrams showing the flow pathways on the control surface without the presence of cavity.

Here $R_{side}$ and $R_{cavity}$ are the flow resistances in the side-channel and cavity, respectively. In addition, on the control surface without the use of cavity structure, the hydraulic resistances along the spreading direction and the pinning direction are definitely identical. FIGS. 11A to 11B.

To build a link between surface topography and the liquid diode behavior, we defined a dimensionless ratio parameter R' of flow resistance at the pinning direction to flow resistance at the spreading direction just across single U-shaped island unit.

$$R'=+R_p/R_s=1+R_{side}/2R_{cavity} \tag{S6}$$

In order to numerically calculate the flow resistance and the parameter R', we developed a MATLAB code based on the above derivation with the following steps:
(1) The diverging side-channel and converging cavity have rectangular cross-sections, but their cross-sections vary with the spatial location x. Set the unit channel length dl and assume that the rectangular cross-sections within unit length dl are constant.
(2) Give the data of channel widths for side-channel $w_{side}(x)$ and cavity $w_{cavity}(X)$ within single U-shaped island unit based on the specified unit length dl.
(3) Compute the hydraulic resistance function for side-channel and cavity based on corresponding channel width w(x), height h and unit length dl.
(4) According to derivation in this section, couple all the channels in parallel or in series to calculate the hydraulic resistance $R_s$ and $R_p$, and finally compute the value of the parameter R'.

Based on the above ideas, the value of the dimensionless parameter R' can be calculated by the following formula, $$R' = \frac{\sum_{x \in (0,l)} \frac{2\Lambda}{(2w_{side}(x) + w_{cavity}(x))} + \sum_{x \in (l,L)} \frac{\Lambda}{w_{side}(x)}}{\sum_{x \in (0,L)} \frac{\Lambda}{w_{side}(x)}} \tag{S7-7}$$

where $\Lambda = \frac{6 \mu dl}{h^3(1 - 192h\Sigma/\pi^5 w)}$.

Finally, the correlation between surface topography and R' was investigated. The R' can be tailored by varying sizes in the cavity length or width, which regulate the rectification coefficient on the liquid diodes. Please see FIGS. 12A to 13B. Interestingly, experimental results based on the liquid diodes with varying topographies reveal that k is linearly proportional to R'. Please see FIG. 3E. Thus, the rectification coefficient can be regulated by changing the relative size of cavity without affecting the liquid transport.

FIG. 11A illustrates the hydraulic resistance $R_s$ at the spreading direction; FIG. 11B illustrates the hydraulic resistance $R_p$ at the pinning direction. Blue area denotes the liquid in the channels and the dark blue arrows denote the direction of the flow.

Figure 12A:
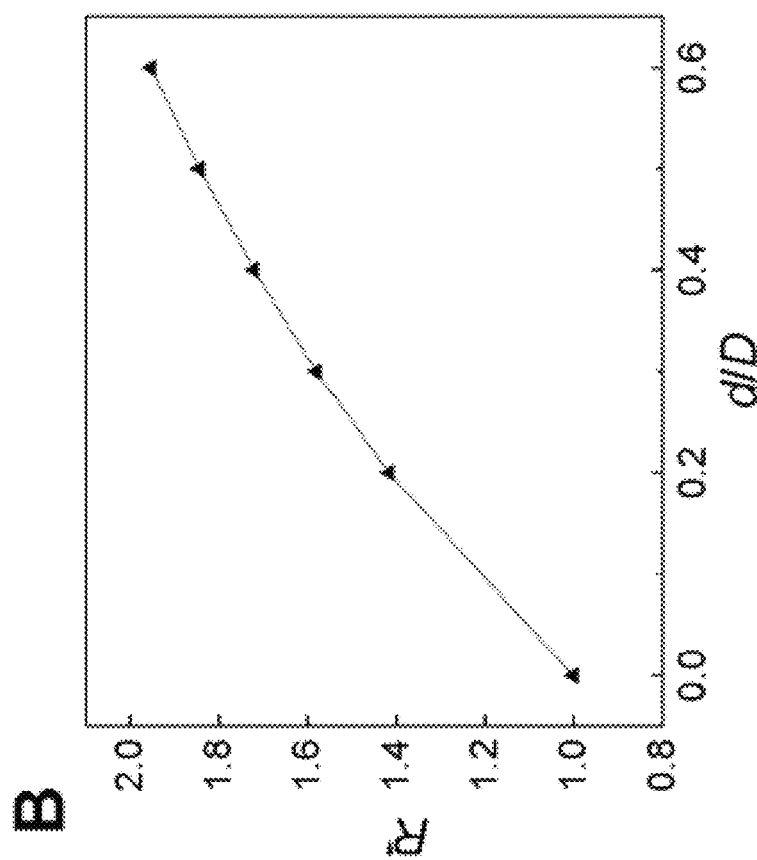
FIGS. 12A to 12B are graphs showing effects of structural topography on flow resistance parameter R'.

FIG. 12A shows variation of R' as a function of the length of cavity normalized by the total length of U-shaped island.

Figure 12B:
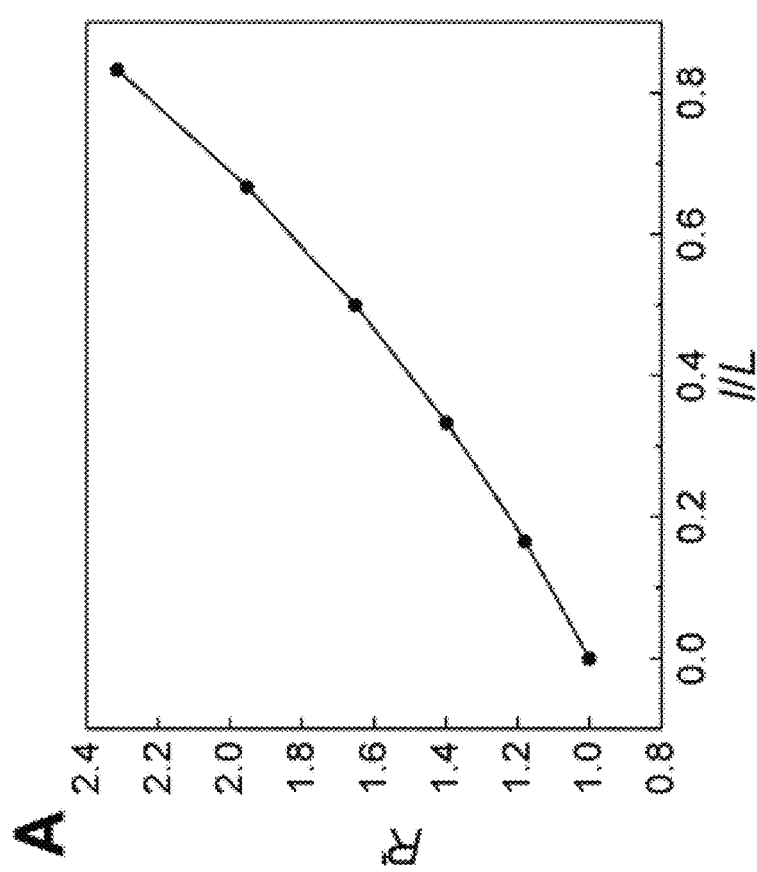

FIG. 12B shows variation of R' as a function of the width of cavity normalized by the width of U-shaped island.

Figures 13A, 13B:
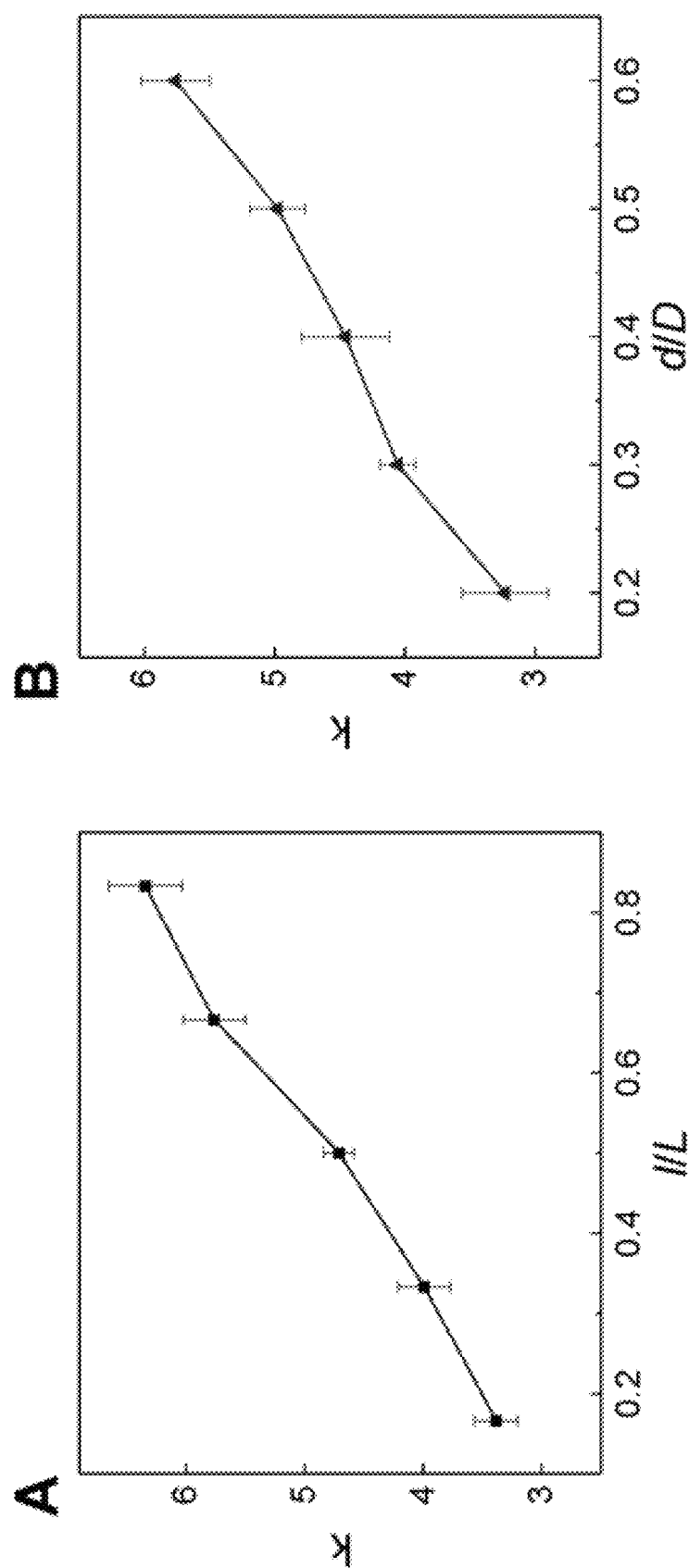
FIGS. 13A to 13B are graphs showing effects of structural topography on rectification coefficient k.

FIG. 13A shows the variation of k on the liquid diodes as a function of the cavity length normalized by the total length of the U-shaped island. FIG. 13B shows the variation of k on the liquid diodes under a function of the cavity width normalized by the total width of the U-shaped island.

5.3 Characterization of Macroscopic Spreading Dynamics on Control Surfaces

Figures 14A, 14B, 14C:
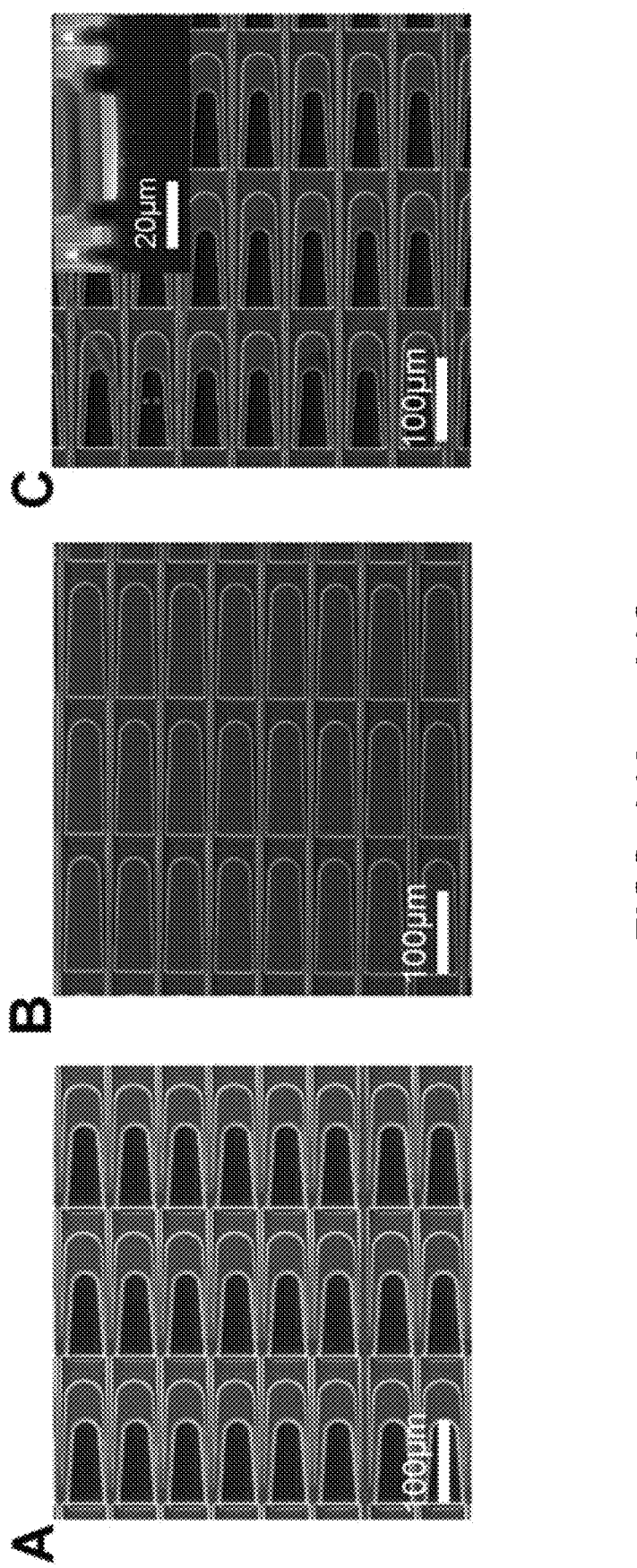
FIGS. 14A to 14C are representation of SEM characterization of control surfaces.

FIG. 14A is a SEM image of control surface in which the side-channels are obstructed.

FIG. 14B is a SEM image of control surface in which the cavities are obstructed. FIG. 14C is a SEM image of control surface with a straight sidewall in the inner side of the cavity. The inset image shows the magnified cross-sectional view of the cavity.

Figures 15A, 15B, 15C:
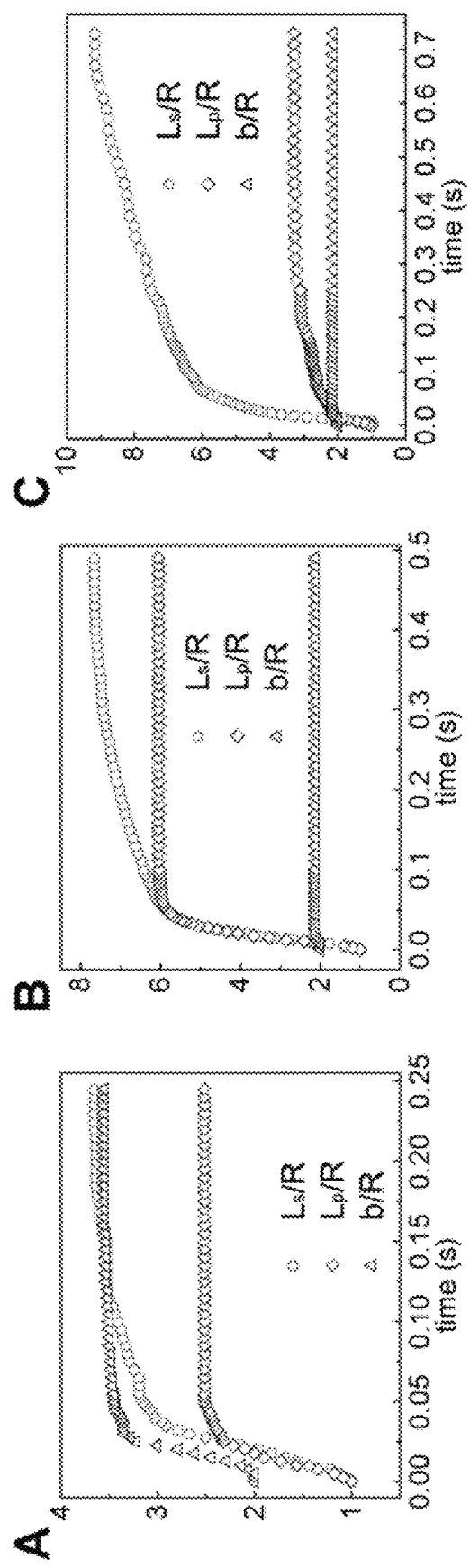
FIGS. 15A to 15C are graphs showing spreading dynamics on the control surfaces.

FIG. 15A shows spreading dynamics on the control surface without the presence of side-channel. FIG. 15B shows spreading dynamics on the control surface without the presence of cavity. FIG. 15C shows spreading dynamics on the control surface without the presence of reentrant structure. Red circle and blue diamond symbols indicate the variation of the propagation distance of the contact line normalized by droplet radius R as a function of time in the spreading and the pinning directions, respectively. Black triangular symbols denote the variation of fluid width b normalized by droplet radius R.

5.4 Comparison of Liquid Self-Transportation on Various Surfaces

Figure 16:
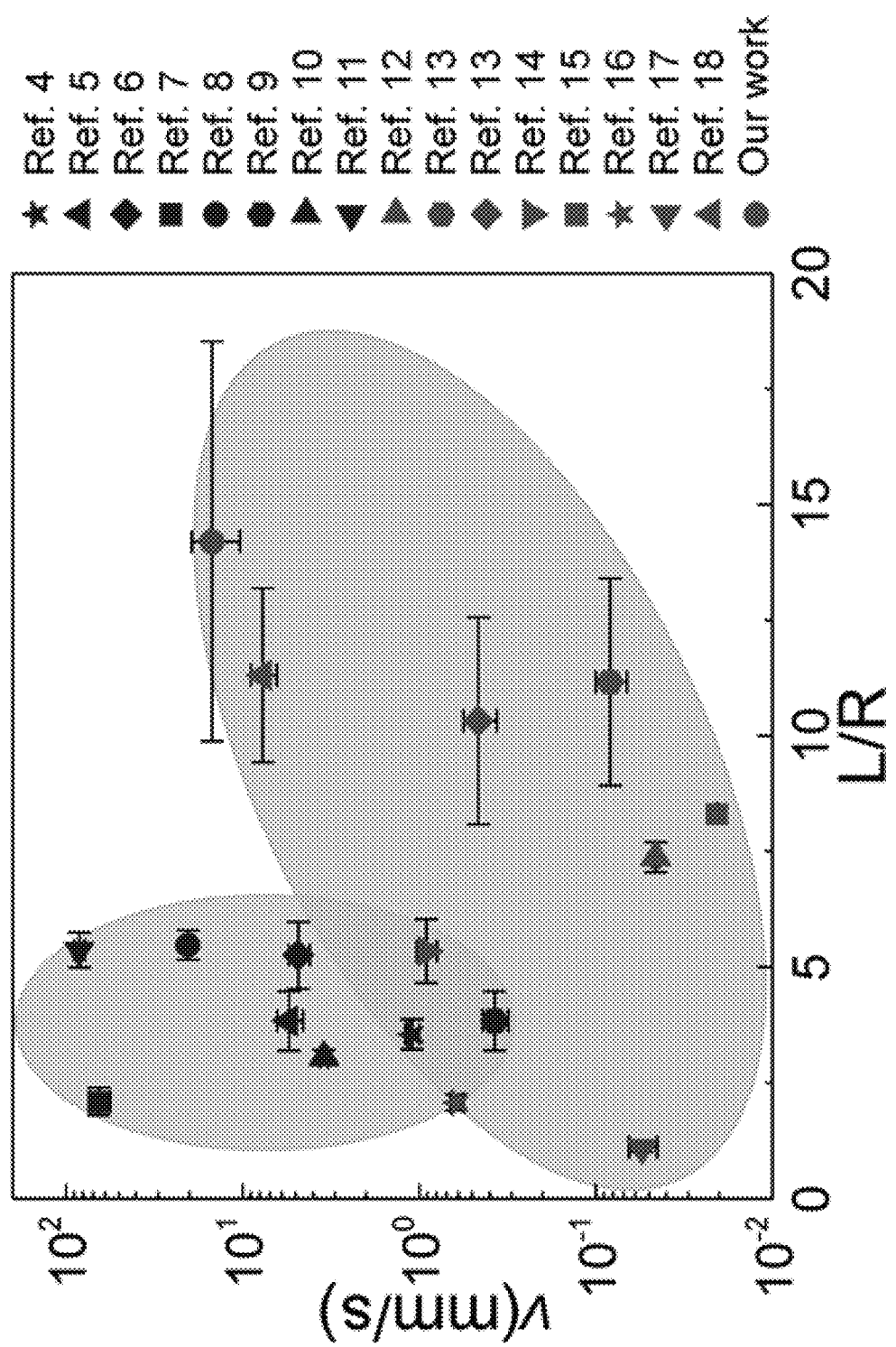
FIG. 16 is a graph showing comparison of transport performances among different surfaces.

To illustrate the advantages of our liquid diode, we benchmark the motion velocity and the range of transport with reported surfaces as shown in FIGS. 4A and 16. Surfaces with an imposed wetting gradient (4-11) are associated with a large spreading velocity (green area) and a short spreading distance owing to inherent conflicts in two parameters. On the contrary, asymmetrically structured surfaces (12-18) give rise to a long range of liquid self-transport and small velocity (blue area). It was recently reported that the peristome surface of pitcher plant (red triangular symbol) elegantly takes advantage of Taylor rise mechanism to attain fast liquid transport. Although this finding offers new insight for the design of directional surface, the structural and functional sophistication of this living organism requires stringent fabrication, and thus it is challenging to replicate and scale up to meet specific applications. A new approach has been developed to create liquid diode (red circular symbol) for the continuous, long-range, and fast self-propelling in the preferential direction.

In FIG. 1, the green area and blue area indicate the surfaces with wettability gradients and asymmetric geometries, respectively. Especially, the red triangular symbol denotes the unidirectional liquid transport on the nature peristome of Pitcher plant. And red circular symbol represents the as-designed liquid diode.

5.5 Temperature Gradient Effect on Liquid Diode

Figures 17A, 17B:
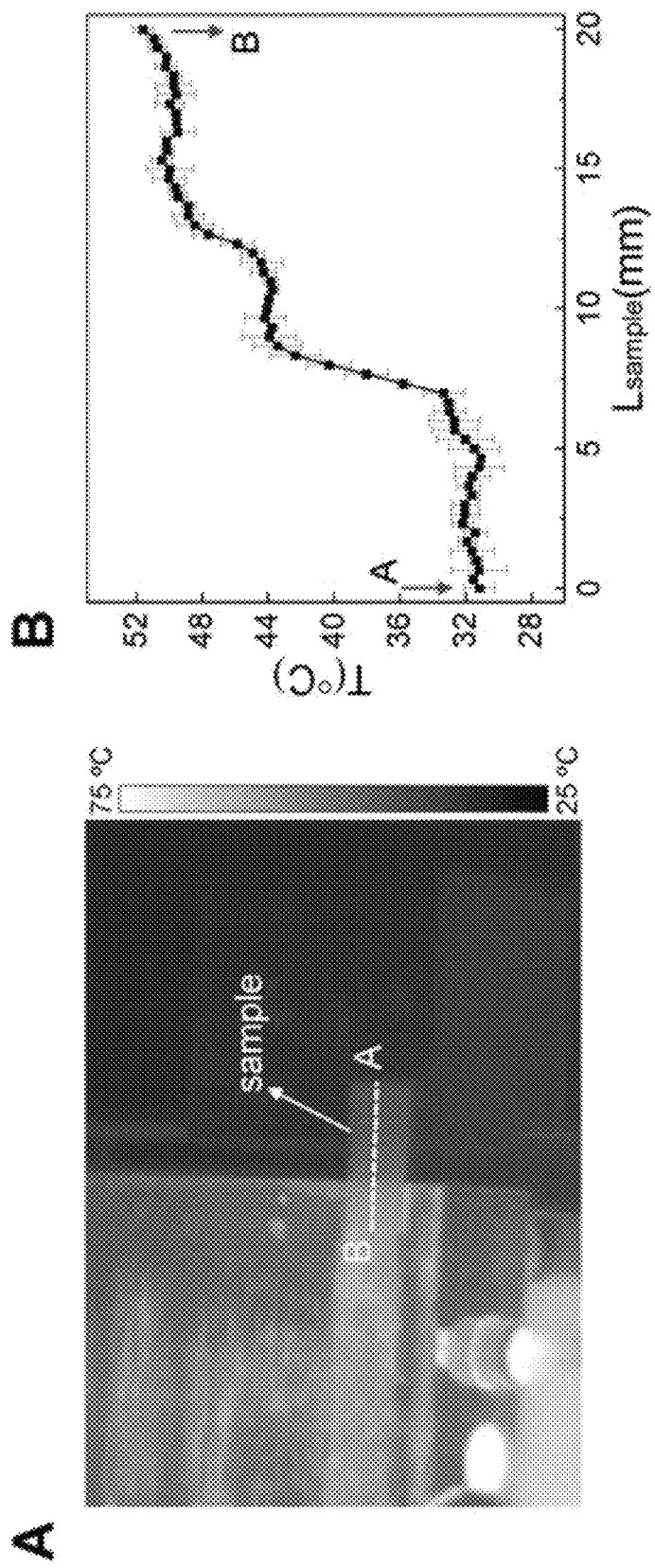
FIGS. 17A to 17B illustrate effect of temperature gradient on the direction transport.

FIG. 17A is an infrared image showing the distribution of temperature on the liquid diode, which is imposed to an additional gradient temperature. FIG. 17B is a graph showing the variation of temperature on the liquid diode surface from A to B.

It should be understood that certain features of the invention, which are, for clarity, described in the content of separate embodiments, may be provided in combination in a single embodiment. Conversely, various features of the invention which are, for brevity, described in the content of a single embodiment, may be provided separately or in any appropriate sub-combinations. It is to be noted that certain features of the embodiments are illustrated by way of non-limiting examples. It is also to be noted that certain features in connection with the invention are not explained in great detail for brevity reason. However, such features are readily understood by a skilled person in the art. Also, a skilled person in the art will be aware of the prior art which is not explained in the above for brevity purpose.

REFERENCES

The following references are incorporated in their entirety and a skilled person is considered to be aware of disclosure of these references.

1. H. A. Stone, A. D. Stroock, A. Ajdari, Engineering flows in small devices: Microfluidics toward a lab-on-a-chip. *Annu. Rev. Fluid Mech.* 36, 381-411 (2004).
2. M. K. Chaudhury, A. Chakrabarti, S. Daniel, Generation of motion of drops with interfacial contact. *Langmuir* 31, 9266-9281 (2015).
3. J. Z. Wang, Z. H. Zheng, H. W. Li, W. T. S. Huck, H. Sirringhaus, Dewetting of conducting polymer inkjet droplets on patterned surfaces. *Nat. Mater.* 3, 171-176 (2004).
4. S. Ralf, B. Martin, P. Thomas, H. Stephan, Droplet based microfluidics. *Rep. Prog. Phys.* 75, 016601 (2012).
5. S. Daniel, M. K. Chaudhury, J. C. Chen, Fast drop movements resulting from the phase change on a gradient surface. *Science* 291, 633-636 (2001).
6. W. S. Wong, M. Li, D. R. Nisbet, V. S. Craig, Z. Wang, A. Tricoli, Mimosa origami: A nanostructure-enabled directional self-organization regime of materials. *Sci. Adv.* 2, e1600417 (2016).
7. K.-H. Chu, R. Xiao, E. N. Wang, Uni-directional liquid spreading on asymmetric nanostructured surfaces. *Nat. Mater.* 9, 413-417 (2010).
8. K. C. Park, P. Kim, A. Grinthal, N. He, D. Fox, J. C. Weaver, J. Aizenberg, Condensation on slippery asymmetric bumps. *Nature* 531, 78-82 (2016).
9. N. A. Malvadkar, M. J. Hancock, K. Sekeroglu, W. J. Dressick, M. C. Demirel, An engineered anisotropic nanofilm with unidirectional wetting properties. *Nat. Mater.* 9, 1023-1028 (2010).
10. K. Ichimura, S. K. Oh, M. Nakagawa, Light-driven motion of liquids on a photoresponsive surface. *Science* 288, 1624-1626 (2000).
11. J. A. Lv, Y. Liu, J. Wei, E. Chen, L. Qin, Y. Yu, Photocontrol of fluid slugs in liquid crystal polymer microactuators. *Nature* 537, 179-184 (2016).
12. J. Li, Y. Hou, Y. Liu, C. Hao, M. Li, M. K. Chaudhury, S. Yao, Z. Wang, Directional transport of high-temperature janus droplets mediated by structural topography. *Nat. Phys.* 12, 606-612 (2016).
13. M. K. Chaudhury, P. S. Goohpattader, Activated drops: Self-excited oscillation, critical speeding and noisy transport. *Eur. Phys. J. E. Soft Matter* 36, 15 (2013).
14. T. M. Schutzius, S. Jung, T. Maitra, G. Graeber, M. Köhme, D. Poulikakos, Spontaneous droplet trampolining on rigid superhydrophobic surfaces. *Nature* 527, 82-85 (2015).
15. M. Prakash, D. Quéré, J. W. Bush, Surface tension transport of prey by feeding shorebirds: The capillary ratchet. *Science* 320, 931-934 (2008).
16. H. Chen, P. Zhang, L. Zhang, H. Liu, Y. Jiang, D. Zhang, Z. Han, L. Jiang, Continuous directional water transport on the peristome surface of nepenthes alata. *Nature* 532, 85-89 (2016).
17. Y. Zheng, H. Bai, Z. Huang, X. Tian, F.-Q. Nie, Y. Zhao, J. Zhai, L. Jiang, Directional water collection on wetted spider silk. *Nature* 463, 640-643 (2010).
18. P. Comanns, G. Buchberger, A. Buchsbaum, R. Baumgartner, A. Kogler, S. Bauer, W. Baumgartner, Directional, passive liquid transport: The texas horned lizard as a model for a biomimetic 'liquid diode'. *J. R. Soc. Interface* 12, 20150415 (2015).
19. M. K. Chaudhury, G. M. Whitesides, How to make water run uphill. *Science* 256, 1539-1541 (1992).
20. X. M. Yang, Z. W. Zhong, E. Q. Li, Z. H. Wang, W. Xu, S. T. Thoroddsen, X. X. Zhang, Asymmetric liquid wetting and spreading on surfaces with slanted micro-pillar arrays. *Soft Matter* 9, 11113-11119 (2013).
21. V. Jokinen, M. Leinikka, S. Franssila, Microstructured surfaces for directional wetting. *Adv. Mater.* 21, 4835-4838 (2009).
22. C. Li, N. Li, X. Zhang, Z. Dong, H. Chen, L. Jiang, Uni-directional transportation on peristome-mimetic surfaces for completely wetting liquids. *Angew. Chem. Int. Ed.* 55, 14988-14992 (2016).
23. M. J. Hancock, K. Sekeroglu, M. C. Demirel, Bioinspired directional surfaces for adhesion, wetting and transport. *Adv. Funct. Mater.* 22, 2223-2234 (2012).
24. C. Liu, J. Sun, J. Li, C. Xiang, L. Che, Z. Wang, X. Zhou, Long-range spontaneous droplet self-propulsion on wettability gradient surfaces. *Sci. Rep.* 7, 7552 (2017).
25. J. Li, Q. H. Qin, A. Shah, R. H. Ras, X. Tian, V. Jokinen, Oil droplet self-transportation on oleophobic surfaces. *Sci. Adv.* 2, e1600148 (2016).
26. M. Reyssat, F. Pardo, D. Quéré, Drops onto gradients of texture. *Europhys. Lett.* 87, 36003 (2009).
27. H. Zhao, D. Beysens, From droplet growth to film growth on a heterogeneous surface: Condensation associated with a wettability gradient. *Langmuir* 11, 627-634 (1995).
28. M. K. Chaudhury, A. Chakrabarti, T. Tibrewal, Coalescence of drops near a hydrophilic boundary leads to long range directed motion. *Extreme Mech. Lett.* 1, 104-113 (2014).
29. A. Tuteja, W. Choi, M. Ma, J. M. Mabry, S. A. Mazzella, G. C. Rutledge, G. H. McKinley, R. E. Cohen, Designing superoleophobic surfaces. *Science* 318, 1618-1622 (2007).
30. T. Liu, C.-J. Kim, Turning a surface superrepellent even to completely wetting liquids. *Science* 346, 1096-1100 (2014).
31. Y. Chen, C. Zhang, M. Shi, J. Wu, G. Peterson, Study on flow and heat transfer characteristics of heat pipe with axial "ω"-shaped microgrooves. *Int. J. Heat Mass Transfer* 52, 636-643 (2009).
32. C. Li, Z. Wang, P.-I. Wang, Y. Peles, N. Koratkar, G. P. Peterson, Nanostructured copper interfaces for enhanced boiling. *Small* 4, 1084-1088 (2008).
33. M. M. Weislogel, S. Lichter, Capillary flow in an interior corner. *J. Fluid Mech.* 373, 349-378 (1998).
34. M. K. Chaudhury, A. Chaudhury, Super spreading of oil by condensed water drops. *Soft Matter* 1, 431-435 (2005).
35. J. W. Bush, J. M. Aristoff, A. Hosoi, An experimental investigation of the stability of the circular hydraulic jump. *J. Fluid Mech.* 558, 33-52 (2006).
36. E. Dressaire, L. Courbin, J. Crest, H. A. Stone, Thin-film fluid flows over microdecorated surfaces: Observation of polygonal hydraulic jumps. *Phys. Rev. Lett.* 102, 194503 (2009).

37. M. A. Lomholt, L. Lizana, R. Metzler, T. Ambjornsson, Microscopic origin of the logarithmic time evolution of aging processes in complex systems. *Phys. Rev. Lett.* 110, 208301 (2013).
38. D. J. Beebe, G. A. Mensing, G. M. Walker, Physics and applications of microfluidics in biology. *Annu. Rev. Biomed. Eng.* 4, 261-286 (2002).
39. O. Bliznyuk, H. P. Jansen, E. S. Kooij, H. J. W. Zandvliet, B. Poelsema, Smart design of stripe-patterned gradient surfaces to control droplet motion. *Langmuir* 27, 11238-11245 (2011).
40. C. Sun, X.-W. Zhao, Y.-H. Han, Z.-Z. Gu, Control of water droplet motion by alteration of roughness gradient on silicon wafer by laser surface treatment. *Thin Solid Films* 516, 4059-4063 (2008).
41. J. Wu, R. Ma, Z. Wang, S. Yao, Do droplets always move following the wettability gradient? *Appl. Phys. Lett.* 98, 204104 (2011).
42. Y. Ito, M. Heydari, A. Hashimoto, T. Konno, A. Hirasawa, S. Hori, K. Kurita, A. Nakajima, The movement of a water droplet on a gradient surface prepared by photodegradation. *Langmuir* 23, 1845-1850 (2007).
43. X. Zhu, H. Wang, Q. Liao, Y. D. Ding, Y. B. Gu, Experiments and analysis on self-motion behaviors of liquid droplets on gradient surfaces. *Exp. Therm Fluid Sci.* 33, 947-954 (2009).
44. H. S. Khoo, F.-G. Tseng, Spontaneous high-speed transport of subnanoliter water droplet on gradient nanotextured surfaces. *Appl. Phys. Lett.* 95, 063108 (2009).
45. H. Chen, L. Zhang, P. Zhang, D. Zhang, Z. Han, L. Jiang, A novel bioinspired continuous unidirectional liquid spreading surface structure from the peristome surface of nepenthes alata. *Small* 13, 1601676 (2017).
46. T.-i. Kim, K. Y. Suh, Unidirectional wetting and spreading on stooped polymer nanohairs. *Soft Matter* 5, 4131-4135 (2009).
47. A. Kundan, T. T. T. Nguyen, J. L. Plawsky, P. C. Wayner, D. F. Chao, R. J. Sicker, Condensation on highly superheated surfaces: Unstable thin films in a wickless heat pipe. *Phys. Rev. Lett.* 118, 094501 (2017).
48. F. M. White, I. Corfield, Viscous fluid flow. (McGraw-Hill New York, 2006), vol. 3.
49. J. Castillo-León, W. E. Svendsen, *Lab-on-a-chip devices and micro-total analysis systems: A practical guide.* (Springer, 2014).
50. M. K. Chaudhury, G. M. Whitesides, How to make water run uphill. *Science* 256, 1539-1541 (1992).
51. O. Bliznyuk, H. P. Jansen, E. S. Kooij, H. J. W. Zandvliet, B. Poelsema, Smart design of stripe-patterned gradient surfaces to control droplet motion. *Langmuir* 27, 11238-11245 (2011).
52. J. Li, Q. H. Qin, A. Shah, R. H. Ras, X. Tian, V. Jokinen, Oil droplet self-transportation on oleophobic surfaces. *Sci. Adv.* 2, e1600148 (2016).
53. Y. Ito, M. Heydari, A. Hashimoto, T. Konno, A. Hirasawa, S. Hori, K. Kurita, A. Nakajima, The movement of a water droplet on a gradient surface prepared by photodegradation. *Langmuir* 23, 1845-1850 (2007).

The invention claimed is:

1. A unidirectional liquid transport system comprising an array of elongate units, wherein:
    each said unit is defined by a surrounding fencing;
    each said unit includes a region generally resembling a U-shaped micro-scale island with a proximal end on one side having an opening and a distal end on the opposite side thereof;
    a channel is defined between a lateral side of the island and an adjacent fencing thereof, and the channel is divergent from the proximal end towards the distal end, with a divergence angle α of the channel of 0°<α<10°;
    said island is provided with a reentrant member defining an outer rim with a width "D" at the proximal end and with a length "L";
    said island provided with the reentrant member defines an inner rim with a width "d" at the proximal end and with a length "l";
    the width of the channel at the proximal end is 0>s>30 µm;
    "D" is substantially 0 to 1 mm;
    "L" is 0 to 1 mm;
    0<"d"<"D"; and
    0<"l"<L.

2. A system as claimed in claim 1, wherein each said unit has a rectangular profile.

3. A system as claimed in claim 1, wherein said island is arranged between a pair of said channels on opposite lateral sides thereof.

4. A system as claimed in claim 1, wherein said island is provided with a trough surrounded by the reentrant member and the proximal end of said island resembles the opening of the trough, and wherein, in use, liquid migration moves in a direction from the opening to the distal end of said island.

5. A system as claimed in claim 1, wherein said reentrant member generally resembles a lip inwardly extending and defining the outer and inner rims of said island.

6. A system as claimed in claim 5, wherein said lip at the inner rim has a curved or concave configuration.

7. A system as claimed in claim 5, wherein said trough has a substantially flat floor.

8. A system as claimed in claim 7, wherein said lip is arranged substantially in parallel to said floor.

9. A system as claimed in claim 5, wherein the length of said lip, δ, is 1 µm<δ<10 µm.

10. A system as claimed in claim 1, wherein the array is formed from photolithography.

11. A unidirectional liquid transport system comprising an array of elongate units, wherein:
    each said unit is defined by a surrounding fencing;
    each said unit includes a region generally resembling a U-shaped micro-scale island with a proximal end on one side having an opening and a distal end on the opposite side thereof;
    a channel is defined between a lateral side of the island and an adjacent fencing thereof, and the channel is divergent from the proximal end towards the distal location on the opposite side thereof;
    said island includes a reentrant member configured to, upon contact with droplets of a liquid to be transported, initially arrest flow of the liquid and produce a pinning acting to allow building up of excess surface energy, and subsequently cause coalescence of the liquid thus converting the surface energy to kinetic energy for movement of the liquid; and
    surfaces of the units are fabricated on silicon wafer.

12. A system as claimed in claim 11, wherein:
    said reentrant member has an outer rim with a width "D" at the proximal end and with a length "L";
    said island has the reentrant member with an inner rim with a width "d" at the proximal end and with a length "l";
    the width of the channel at the proximal end is 0>s>30 µm;
    "D" is substantially 0 to 1 mm;
    "L" is 0 to 1 mm;
    0<"d"<"D"; and
    0<"l"<L.

13. A method of manufacture of a unidirectional liquid transport system of claim 11, comprising the sequential steps of:
- depositing a layer of photoresist as a protective mask by photolithography;
- effecting an anisotropic etching via reactive ion etching;
- removing the photoresist by plasma stripping and wet cleaning;
- fabricating a mask layer to deposit a layer of silicon oxide;
- photolithographic patterning to selectively remove the silicon oxide layer on positions of cavity structures desired to be formed; and
- isotropically etching silicon for exposing the cavity structures.

14. A method as claimed in claim 13, wherein the anisotropic etching is deep reactive ion etching (DRIE).

15. A method as claimed in claim 13, wherein the mask layer is formed by thermal oxidation.

16. A method as claimed in claim 13, wherein the mask layer has a thickness of substantially 1 μm.

17. A method as claimed in claim 13, wherein the photolithographic patterning is reactive ion etching.

18. A method as claimed in claim 13, wherein the isotropically etching is deep reactive ion etching (DRIE) or $XeF_2$.

* * * * *